United States Patent [19]

Jain

[11] Patent Number: 4,924,257

[45] Date of Patent: May 8, 1990

[54] SCAN AND REPEAT HIGH RESOLUTION PROJECTION LITHOGRAPHY SYSTEM

[76] Inventor: Kantilal Jain, 18 Algonquian Trail, Briarcliff Manor, N.Y. 10510

[21] Appl. No.: 253,717

[22] Filed: Oct. 5, 1988

[51] Int. Cl.$^5$ .............................................. G03B 27/42
[52] U.S. Cl. ....................................... 355/53; 355/77; 250/492.2
[58] Field of Search ............................. 355/43, 53, 77; 356/400, 401; 250/548, 442.1, 205, 491.1, 492.2, 492.3

[56] References Cited

U.S. PATENT DOCUMENTS

| | | | |
|---|---|---|---|
| 4,701,608 | 10/1987 | Morita et al. | 250/205 |
| 4,748,477 | 5/1988 | Isohata et al. | 355/53 |
| 4,749,867 | 6/1988 | Matsushita et al. | 250/442.1 |
| 4,825,086 | 4/1989 | Mueller | 250/492.2 X |

Primary Examiner—L. T. Hix
Assistant Examiner—D. Rutledge
Attorney, Agent, or Firm—Carl Kling

[57] ABSTRACT

This scan and repeat lithography system has high resolution capability, large effective image field size, and high substrate exposure speed, and comprises: (a) a substrate stage capable of scanning a substrate in one dimension and, when not scanning in said dimension, capable of moving laterally in a direction perpendicular to the scan direction so as to position the substrate for another scan; the substrate stage exposing the full substrate by breaking up the substrate area into parallel strips, and exposing each of the strips by scanning the length of the strip across a fixed illumination region; (b) a mask stage capable of scanning in the same direction as, and synchronized with, the substrate stage, at a speed faster than the substrate stage scanning speed by a certain ratio M; (c) an illumination subsystem having an effective source plane in the shape of a polygon, and capable of uniformly illuminating a polygon-shaped region on the mask; (d) a projection subsystem having an object-to-image reduction ratio M, and having a polygon-shaped image field of an area smaller than the desired effective image field size of the lithography system; and (e) provision of complementary exposures in an overlap region between the areas exposed by adjacent scans in such a way that a seam in the exposure dose distribution received on the substrate is absent between the scans, and such that the exposure dose delivered across the entire substance is uniform.

22 Claims, 5 Drawing Sheets

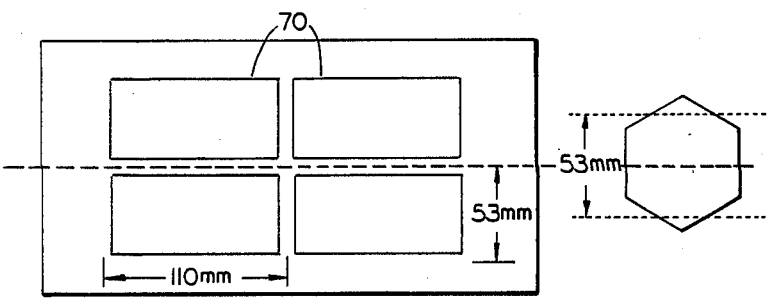
FIG. 8A
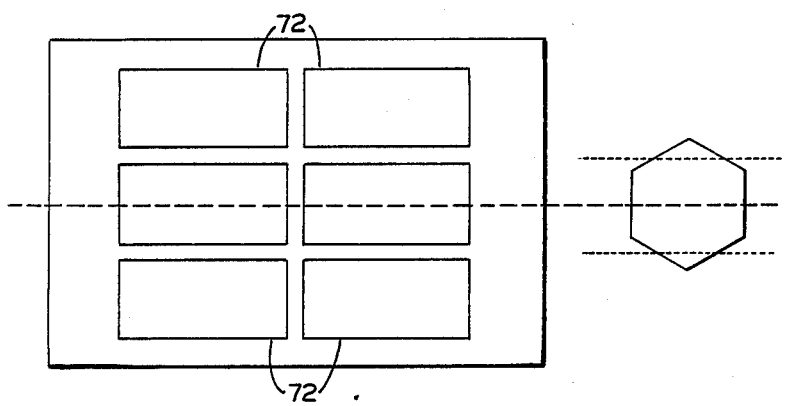
FIG. 8B
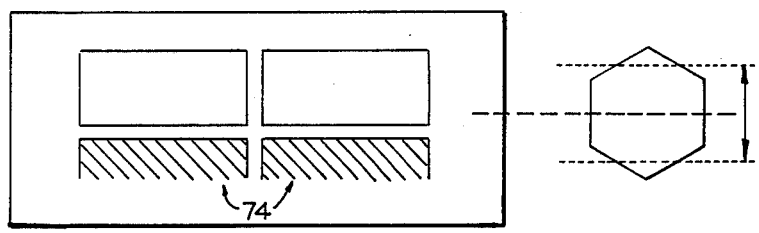
FIG. 8C
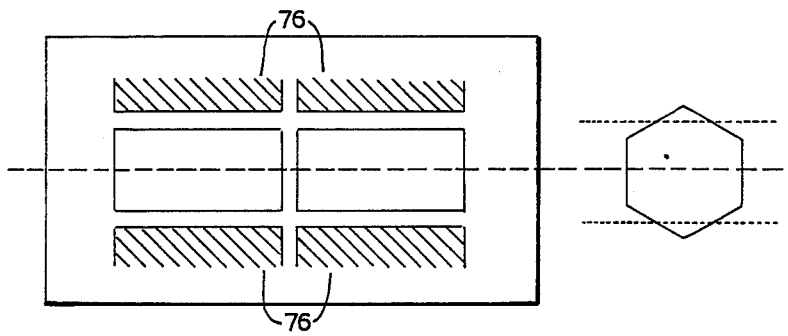
FIG. 8D
FIG. 8

TABLE I

| $D_S$ = RESIST SENSITIVITY (mJ/cm$^2$) | 10 | | | 50 | | | 100 | | |
|---|---|---|---|---|---|---|---|---|---|
| f = LASER PULSE REPETITION RATE (Hz) | 303 | 204 | 98 | 303 | 204 | 98 | 303 | 204 | 98 |
| N = NUMBER OF OVERLAPPING PULSES | 37 | 25 | 12 | 37 | 25 | 12 | 37 | 25 | 12 |
| $E_w$ = ENERGY DONS. / PULSE AT WAFER (mJ/cm$^2$) | 0.27 | 0.40 | 0.83 | 1.35 | 2.00 | 4.17 | 2.70 | 4.00 | 8.33 |
| $e_w$ = ENERGY PER PULSE AT WAFER (mJ) | 0.35 | 0.52 | 1.08 | 1.76 | 2.60 | 5.42 | 3.51 | 5.20 | 10.8 |
| $P_w$ = POWER INCIDENT ON WAFER (mW) | 106 | 106 | 106 | 530 | 530 | 530 | 1060 | 1060 | 1060 |
| $P_L$ = LASER POWER (W) | 0.53 | 0.53 | 0.53 | 2.65 | 2.65 | 2.65 | 5.30 | 5.30 | 5.30 |

FIG.10

TABLE II. WAFER THROUGHPUT CALCULATION

| WAFER DIAMETER (mm) | CHIP SIZE (mm x mm) | NUMBER OF CHIPS ON WAFER | THROUGHPUT (WAFERS/HR) | | |
|---|---|---|---|---|---|
| | | | EVERY SITE ALIGN | EVERY 4th SITE ALIGN | EVERY 10th SITE ALIGN |
| 125 | 10.6 x 22 | 52 | 68.7 | 97.8 | 105.9 |
| 150 | 10.6 x 22 | 75 | 54.0 | 81.3 | 90.2 |
| 200 | 10.6 x 22 | 134 | 34.9 | 57.0 | 65.2 |

FIG.11

SCAN AND REPEAT HIGH RESOLUTION PROJECTION LITHOGRAPHY SYSTEM

BACKGROUND OF THE INVENTION

1. Field of the Invention

This invention relates to lithography systems for imaging patterns, and more particularly relates to lithography method and apparatus having a scan and repeat system characterized by complementary edge illumination by adjacent scans for producing precise images of a high resolution pattern from a mask onto a substrate at a high speed and over an image field substantially larger than the maximum field size of the imaging optics.

2. Description of the Prior Art

Lithography systems are extensively used in the production of integrated circuit chips and electronic circuit boards. Such systems typically include a primary exposure source such as a high intensity lamp or a laser or source of other radiation, mask and substrate positioning systems, a projection system to illuminate and image the pattern present on the mask onto the substrate, and a control system. The intent typically is to illuminate a wafer coated with a layer of a radiation-sensitive material so as to produce the desired circuit pattern, which later will be metallized or otherwise activated during further processing. Illumination may be by ultraviolet light or visible light or other radiation such as X-rays or electron beam. The desire is to illuminate the target regions selectively so as to activate a particular pattern. Integrated circuit chips typically undergo numerous illumination steps and physical treatment steps during production.

As the demand for chips with ever greater memory and processing capability increases, the individual bits on the chips get smaller in dimensions. This requires that the lithography equipment used for imaging these patterns have higher and higher resolution. Simultaneously, the larger physical size of the chips demands that the higher resolution be achieved over a larger image field.

An approach in the prior art to achieve high resolution is to use reduction optical imaging systems in which the pattern on the mask is reduced by a factor of 5-10 when reproduced on the wafer. Since such a reduction system is capable of high resolution only over a limited image field, the exposure region is confined to one chip size, approximately of an area 1 cm$^2$. The entire wafer is processed by exposing a chip, stepping to the next chip, and repeating the process. In these prior art machines, known as step and repeat systems, the limiting performance capability is determined by the reduction projection lens assembly which typically consists of a large number of individul lens elements. As the resolution requirements increase, the design complexity of this lens increases. Further, if a lens is designed for a higher resolution, typically its image field size decreases. To design and build a lens with both higher resolution and larger field size is a task of great difficulty.

Another approach in the prior art has been to use an imaging system with 1:1 magnification ratio, in which the wafer is exposed through a long and narrow curved slit, and in which imaging over the entire wafer is achieved by scanning the whole wafer once across this long and narrow slit. Although such systems are capable of exposing large chips, they are severely limited in their resolution capabilities due to their small numerical aperture. Furthermore, as device resolution requirements shrink to submicron dimensions, and especially to 0.5 micron and below, such scanning systems suffer from the additional difficulty of requiring masks of the same high resolution as the devices to be produced. Consequently, these systems have not found much use for production of integrated circuit chips with submicron dimensions.

Another prior art to achieve a large image field is to use an imaging system known as Wynne-Dyson design which has a magnification ratio of 1:1. Although such systems can expose large chips, since their magnification ratio is 1:1, they suffer from the same disadvantages as stated in the above paragraph, namely, their resolution capability is severely limited because the mask requirements are made greatly more difficult.

Prior art lithography approaches employing electron beam illumination have used either a focused electron beam with a bit-by-bit serial writing process, or shadow projection through a 1:1 stencil mask. These systems suffer from the disadvantages of, respectively, low exposure speed and requirement of a complex and difficult mask technology. Prior art X-ray lithography systems have similarly used shadow printing through 1:1 membrane masks and thus, as discussed in the above paragraphs, have the same disadvantages due to 1:1 patterning and difficult mask requirements.

In view of the limitations in prior art as discussed above, there is an important need to develop a lithography system which delivers superior resolution, high exposure speed and greatly extended field size.

SUMMARY OF THE INVENTION

The object of the invention is to provide a lithography system, that produces both a high resolution capability and a large effective image field size, as well as high throughput rate of processing, for producing precise images of a high resolution mask onto a substrate, such as a semiconductor wafer.

A feature of the invention is a mechanism, herein termed 'scan and repeat' mechanism, for producing an image of the mask over a certain field, then simultaneously scanning the substrate and the mask across the above field, then moving the substrate laterally so as to expose a new scan region, and then repeating the scan several times to expose the entire substrate.

Another feature of this invention is the provision of a hexagonal image field, and scanning across this hexagonal field.

Another feature of the invention is the provision of complementary exposures in an overlap region between adjacent scans in such a way that a seam characteristic of differently exposed substrate region between the scans is totally absent, and such that the illumination exposure dose delivered across the entire substrate is uniform.

Another feature of the invention is a mechanism for periodically resetting the mask such that the mask may contain multiple chip fields and yet not be of unreasonably large size.

Still another feature of the invention is a feedback control system for incrementally scanning the substrate with constant exposure dosage and with exact position control so as to greatly facilitate the frequent re-registration of the substrate to the mask at the desired interval.

The advantage of the invention is its high speed coupled with its ability to obtain high resolution over an image field significantly greater than the undistorted field size of its imaging optics, thus providing for high-throughput production of integrated circuit chips of significantly larger dimensions.

Other objects, features and advantages of the invention will be apparent to those skilled in the art by understanding the description of the preferred embodiments as explained in the following text and as illustrated in the accompanying drawings.

BRIEF DESCRIPTION OF THE DRAWINGS

FIG. 8 is a composite showing representative mask lay-outs with juxtapositions of mask chip fields to hexagonal scan fields which accomplish complementary exposure in the overlap region between adjacent scans and prevent the production of a seam.

FIG. 8A shows the details of the mask lay-out containing 2 m complete chip fields.

FIG. 8B shows the details of the mask lay-out containing 3 m complete chip fields.

FIG. 8C shows the details of the mask lay-out containing m complete and m partial chip fields.

FIG. 8D shows the details of the mask lay-out containing m complete and 2 m partial chip fields.

FIG. 10 shows various exposure parameters, including energy per pulse at wafer and laser power, for different photoresist sensitivities and laser pulse repetition rates.

FIG. 11 gives the wafer throughput values for wafers of various diameters under various alignment situations.

DESCRIPTION OF THE PREFERRED EMBODIMENT

This invention makes it possible to produce a lithography system that has all of the following characteristics: (a) it is capable of high resolution in producing images of a mask pattern onto a substrate; (b) it has a large effective image field; and (c) it has a high throughput rate of exposing the substrates. The aparatus to accomplish these characteristics includes a substrate stage capable of scanning and moving laterally; a mask stage capable of scanning and resetting, and functionally coupled to the substrate stage; an illumination system; a projection lens assembly; and a contol system.

Figure 1:
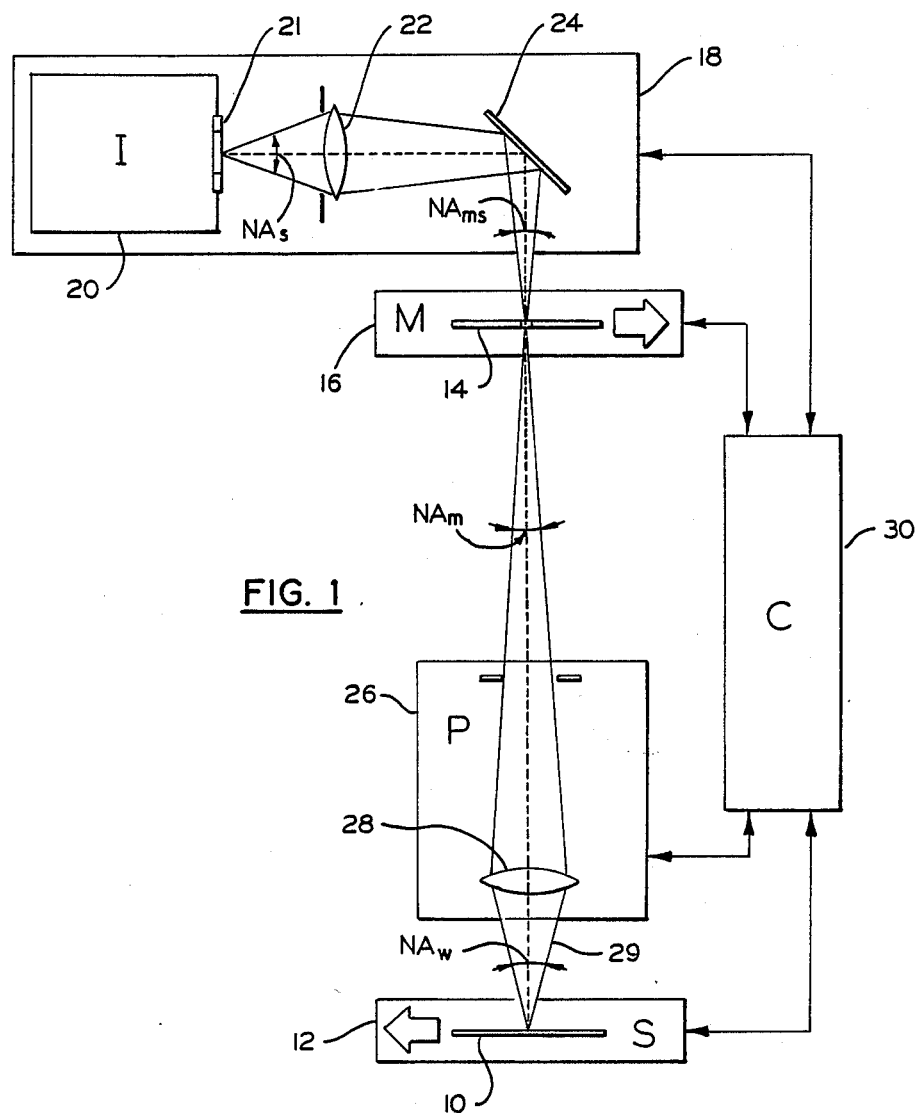
FIG. 1 is a composite illustration of a scan and repeat lithography system, showing an illumination system, a mask held in a mask stage, a projection lens assembly, a substrate held in a substrate stage, and a control system.

FIG. 1 illustrates the essential components of the apparatus. The substrate (10), such as a semiconductor wafer, coated with a layer of photosensitive material, is affixed rigidly in substrate stage 12. The mask (14), which contains the high resolution pattern that is to be imaged on the substrate 10, is affixed rigidly in the mask stage 16. Both the substrate stage 12 and the mask stage 16 are capable of fine precision movements, the details of which will be described shortly. The mask (14) is illuminated by radiation from the illumination system 18, which consists of illumination source system 20, relay lens 22, and beam steering means 24, such as a front-surface 45° mirror. The illumination source system 20 is such that its effective emission plane, 21, is in the shape of a regular hexagon. Relay lens 22 collects radiation into a certain numerical aperture, $NA_s$, from the hexagon shaped effective source plane (21) and images it with a certain magnification and numerical aperture, $NA_{ms}$, on the mask (14). Projection lens assembly 26, which consists of several individual lens elements 28, forms a precise image of the high resolution pattern within the hexagon shaped illuminated region on the mask, with a certain reduction ratio M, onto the substrate 10. The projection lens assembly 26 has a numerical aperture $NA_m$ on the mask side and $NA_w$ on the substrate side. $NA_w$ is determined by the resolution requirements of the lithography system, and $NA_m$ is related to $NA_w$ by $NA_m = NA_w/M$. The projection lens assembly 26 is designed for as large a circular image field as possible (shown as 31 in FIG. 2), and the exposure region on the substrate is then defined as the largest regular hexagon (shown as 32 in FIG. 2) that can be inscribed within the above circular field.

Returning to FIG. 1, the substrate stage 12 now scans the substrate 10 across its hexagon-shaped exposure region, and simultaneously the mask stage 16 scans the mask 14 across its hexagon-shaped illuminated region, so as to cover the length of the substrate in the direction of the scan. During such a scan, the mask stage 16 resets the mask to its original position several times. After completion of a scan across the substrate length, the substrate stage 12 moves the substrate 10 in a direction orthogonal to the scan direction and by an amount herein termed 'effective scan width'. Following such a lateral mmovement of the substrate, a new scan is generated by precise movemnts of the substrate and mask stages in the same manner as described above. The effective scan width and the illumination source system are designed with such characteristics that in combination, they produce a transition, from one scan to the next adjacent scan, that is totally seamless and free from any intensity nonuniformity. The above exposure process, thus termed 'scan and repeat' mechanism, is repeated until the entire substrate is exposed with the desired number of patterns. The details of the scanning, stepping, resetting, and repeating movements discussed above will be described presently. Control system 30 is functionally coupled to the illumination system 18, mask stage 16, projection lens assembly 26 and substrate stage 12, and ensures that the mask and substrate stages are aligned appropriately with respect to the projection lens assembly, that the mask and substrate stages per-form the scan and repeat movements with the desired synchronism, and that the illumination system maintains the desired illumination characteristics throughout the exposure of the entire substrate.

Figure 3:
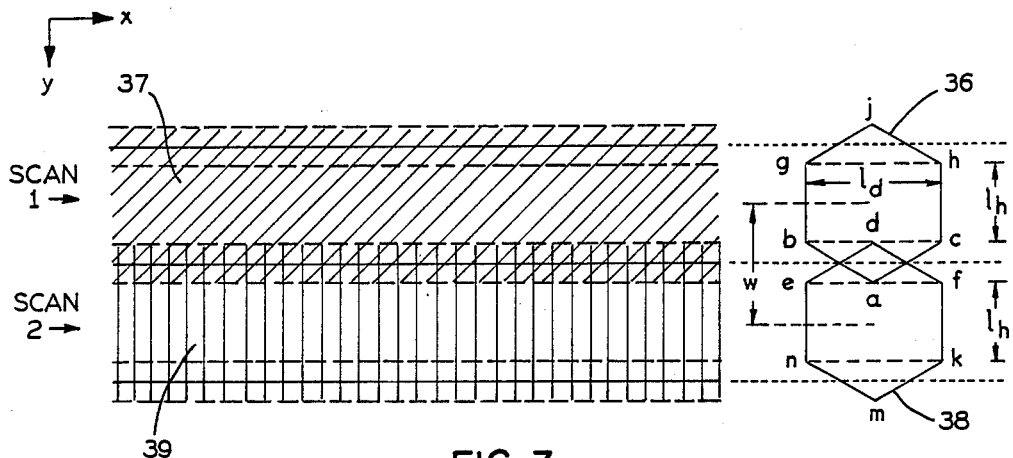
FIG. 3 is an illustraation of the scan and repeat mechanism, showing two adjacent scans and complementary exposure in the overlap area between the two hexagonal illumination regions which generate the seamless exposure transition between the two scans.

Referring to FIG. 3, we next described the mechanism of seamless overlapping hexagon scanning. The regular hexagon 36, also shown as a-b-g-j-h-c, represents the illuminated region on the substrate at any given instant in time. The substrate is scanned across this illumination region from the right to the left. It is important to note that the illumination beam (29 of FIG. 1) itself is stationary, as is the projection lens assembly (26 in FIG. 1). Thus, for the purpose of pictorial illustration, the movement of the substrate across the beam may be effectively depicted as the scanning, from left to right, of the hexagonal illumination region across a stationary substrate. This is shown as scan 1, or 37, in FIG. 3. The orientation of the hexagon 36 is such that one of its sides, for example b-g, is orthogonal to the direction of scan.

To generate the next scan, first the substrate is moved, in a direction orthogonal to the scan direction, by a distance w, determined by $$w = 1.5\, l_h,$$

where $l_h$ is the length of each side of he hexagon. [We will show in a later paragraph that w is the effective scan width.] This new position of the illumination region, relative to the substrate, is 38, also shown as d-e-n-m-k-f. Now scan 2, denoted 39, is generated by scanning the substrate across the hexagonal illumination region 38, in a manner identical to the generation of scan 1.

An important aspect of the scan and repeat mechanism described here, namely the seamless overlap region between adjacent scans, will be discussed next. First let us indicate the non-overlapping regions. In scan 1, the region swept by the rectangular portion b-g-h-c of hexagon 36 is not overlapped by any portion of scan 2. Similarly, in scan 2, the region swept by the rectangular portion e-f-k-n of hexagon 38 is not overlapped by any portion of scan 1. However, the region swept by the triangular segment a-b-c of hexagon 36 in scan 1 is re-swept in scan 2 by the triangular segment d-e-f of hexagon 38. We now shown that the cummulative exposure dose received in the overlapping region is the same as in the non-overlapping regions, and that the transition from scan 1 to scan 2 is sealmess in exposure dose uniformity.

Figure 4:
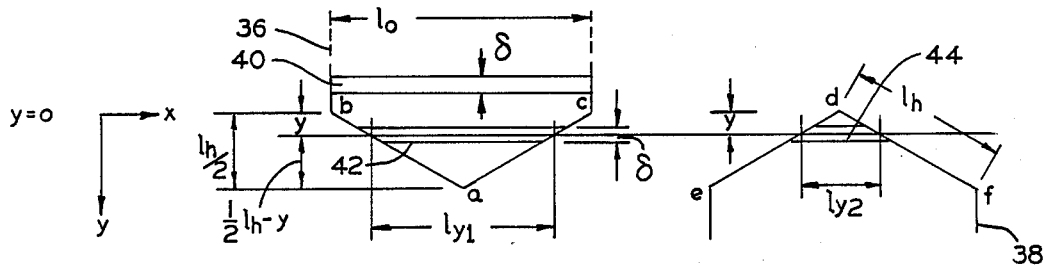
FIG. 4 illustrates the principles of seamless overlapping hexagon scanning.

Referring to FIG. 4, let us consider a segment of hexagon 36 in the form of a strip, 40, of length $l_o$ (cm) and width $\delta$ (cm) in the non-overlapping scan region of the substrate. Let $I_o$ (mW/cm²) be the intensity in the incident beam, $v_x$ (cm/sec) the scan velocity, and $t_o$ (sec) the time the substrate takes to travel a distance $l_o$. Clearly, $t_o = l_o/v_x$. The exposure dose, $D_o$ (mJ/cm²), received by the substrate in the strip 40 is then given by $$D_o = I_o t_o = I_o l_o / v_x = \sqrt{3}\, I_o l_h / v_x.$$

Next, consider a strip 42, again of width $\delta$ and parallel to the scan direction, at a distance y from b-c, or $l_h/2 - y$ from the apex a. The length of strip 42 is given by $$l_{y1} = 2\sqrt{3}\,(l_h/2 - y),$$

and hence the time it takes the substrate to scan a length $l_{y1}$ is $$t_1 = l_{y1}/v_x = 2\sqrt{3}\,(l_h/2 - y)/v_x.$$

Therefore, the dose received in the substrate region scanned by strip 42 is $$D_1 = I_o t_1 = 2\sqrt{3}\,(l_h/2 - y)I_o/v_x.$$

Let us now look at the scanning done by hexagon 38. The segment of hexagon 38, that scans a region that overlaps with the region scanned by strip 42, is the strip 44, and has a width $\delta$, and length $$l_{y2} = 2\sqrt{3}\, y.$$

The scan corresponding to length $l_{y2}$ is $$t_2 = l_{y2}/v_x = 2\sqrt{3}\, y/v_x,$$

and therefore, the dose received in the substrate region scanned by strip 44 is $$D_2 = I_o t_2 = 2\sqrt{3}\, y I_o/v_x.$$

Hence, the cummulative dose in the overlapping region is $$D = D_1 + D_2 = 2\sqrt{3}\,(l_h/2 - y)I_o/v_x + 2\sqrt{3}\, y\, I_o/v_x,$$

or $$D = \sqrt{3}\, l_h I_o/v_x = D_o.$$

Thus, the total exposure dose received at any point in the overlapping regions of the substrate is the same as the dose received in the non-overlapping regions. Furthermore, the entire exposure is seamless because (a) the doses provided by hexagons 36 and 38 taper in opposite directions in the overlapping region, and (b) the doses taper to zero at apex a and apex d, respectively.

In the above discussion, it can be stated that, although the exposure coverage of the substrate is free of any discontinuities, there is a definable parameter of an effective scan width, w—in the sense that the total width (in the direction orthogonal to the scan direction) of the substrate exposed by N scans will be Nw.

Figure 5:
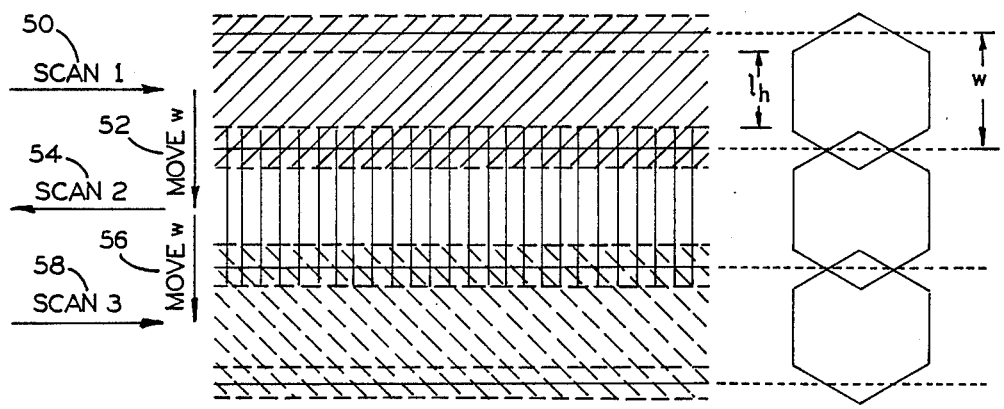
FIG. 5 is a diagram of the preferred embodiment of the scan and repeat mechanism, showing the scan direction alternating between left-to-right and right-to-left with each successive scan, and the substrate movement of w at the end of each scan.

The scan and repeat mechanism described in the preceding paragraphs has incorporated a design such that all scans are in the same direction. Thus, for each scan the substrate travels from right to left, at the end of each scan it returns to its starting position, moves by a distance w in a direction perpendicular to the scan direction, and again travels from right to left for the next scan. In the preferred embodiment, shown in FIG. 5, the scan direction is made to alternate between right-to-left and left-to-right with each successive scan, and the movement by w in the orthogonal direction takes place at the end of each scan, without the substrate returning to the starting position of the just-completed scan. Thus, scan 1 (50) proceeds from left to right, at the end of which the substrate is moved by a distance w (52); then scan 2 (54) is carried out from right to left, at the end of which the substrate is again moved by a distance w (56); then scan 3 (58) is carried out from left to right; and so on. All other details of the mechanism shown in FIG. 5 are identical to those in FIG. 3.

Figure 6:
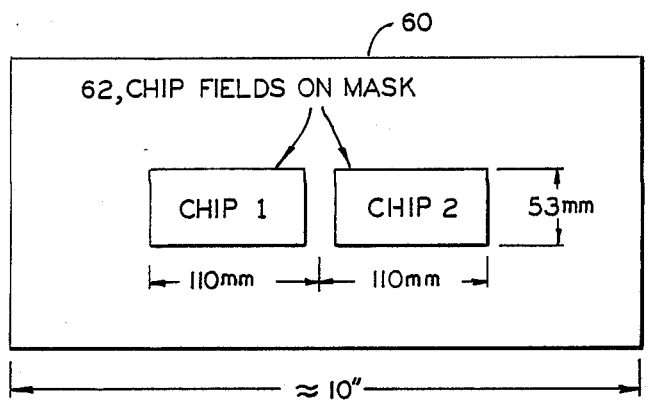
FIG. 6 is an illustration showing the lay-out of the chip fields on the mask.

We now describe the movement of the mask. Since the projection lens has a reduction ratio M, the patterns on the mask are M times larger than those to be imaged on the substrate. If the substrate is a semiconductor wafer on which integrated circuit chips are to be produced, then each chip field on the mask is M times larger than the chip to be produced on the substrate. Further, as the substrate scans across the stationary illumination beam, the mask is scanned simultaneously at a speed M times that of the substrate. However, if the mask scanning were to continue uninterrupted during the entire length of the substrate scan, the mask would have to be of a formidably large size; for example, for a 6-inch diameter semiconductor wafer and a projection lens reduction ratio of 5, the mask would have to be at least 30 inches long, which is impractical. This problem is eliminated as follows. The mask (60 in FIG. 6) is made of a manageable size (for example, 10 inches long), and contains a very small number m (m=2, for example) of complete chip fields, as shown by 62 in FIG. 6. When the scan across these chip fields on the mask is completed, both the substrate and the mask stages are momentarily stopped (66, 68 in FIG. 7). Now the mask stage is reset to its original position, the simultaneous scanning of the mask and the substrate is resumed (see FIG. 7), and another m chips are imaged, after which the mask is again reset. This is repeated until the substrate scan completes the length of the substrate. The substrate alone is now moved by the effective scan width w in a direction perpendicular to the scan direction, and the above process is carried out for the next scan in the opposite direction. No movement of the mask in the y-direction, i.e., the direction perpendicular to the scan direction, is necessary because as described in the case above, the effective mask scan width is designed to be sufficient to cover the width of a mask chip field. In those cases where chip fields wider than the scan width must be exposed, the mask stage is designed with provision for movement in the y-direction.

Having described the fundamental aspects of mask movement, we now add that together with the m complete chip fields, the mask must have additional patterned regions so that, as required by the principle of seamless overlapping scanning, the entire mask area contained within the hexagonal mask illumination region will be imageable onto the substrate. These additional patterned regions on the mask may be in the form of m complete chip fields (70, FIG. 8A), 2 m complete chip fields (72, FIG. 8B), m partial chip fields (74, FIG. 8C), or 2 m partial chip fields (76, FIG. 8D).

Further details of the movements of the mask and substrate stages will now be given. In the preferred embodiment, the illumination source system (20 in FIG. 1) uses a pulsed radiation source, such as a laser or a lamp. In such a situation, the scanning by the substrate and mask stages is made up of multiple stepping movements, and each such step is made to synchronize with a firing of a pulse from the illumination source. Let the pulse repetition rate be f (Hz). Then, for a net substrate stage scan velocity of $v_x$ (cm/sec), the scanning of the substrate state is done in multiples of steps, each of which is $v_x/f$ (cm). Clearly, the mask stage steps are M times larger. When stepping across the mask chip fields is completed, all movements stop, the mask stage is reset, and the process is repeated as before. Such a system for the movements of the stages has two major advantages. First, exposure uniformity is obtained by designing a control mechanism which ensures that a stage step is taken only if the source fires a pulse. Second, since the substrate and mask stages are step-wise synchronized, accurate alignment is possible at any desired interval. Thus, if alignment is to be carried out for every chip, and the chip length is $l_c$ along the scan direction, then alignment must be done after every $l_c f/v_x$ pulses fired by the source or steps taken by the stage. In situations where the illumination source is a continuous source rather than pulsed, the mask-substrate alignment process is not related to the source, and is carried out independently.

Figure 9:
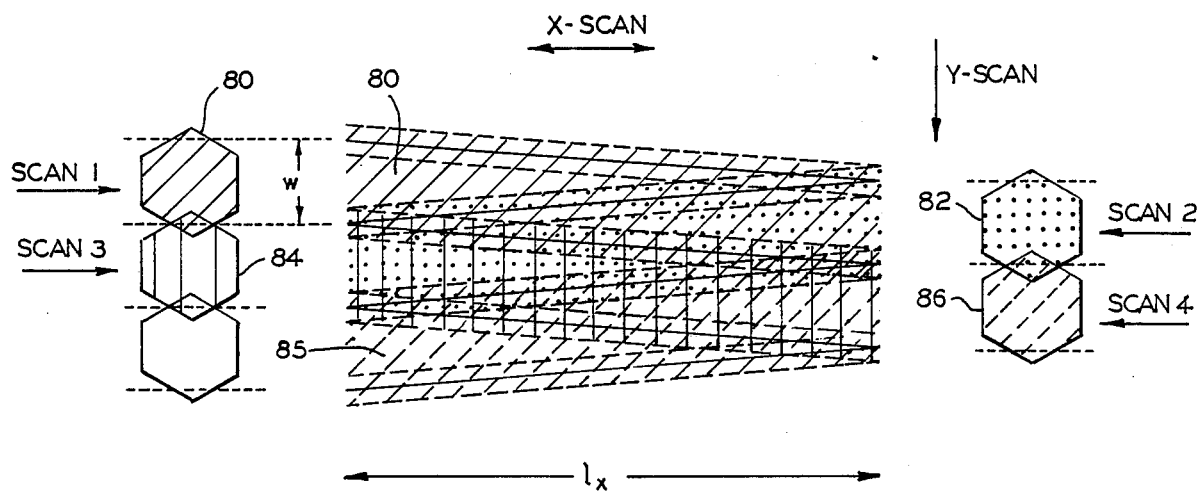
FIG. 9 is a diagram illustrating the principle of simultaneous two-dimensional scanning for high-resolution lithography.

Finally, we describe a variation of the above embodiment. In this embodiment, called 'two-dimensional overlapping scanning', scanning of the mask and substrate stages is carried out simultaneously in both the x-direction and the y-direction. Referring to FIG. 9, scanning in the x-direction begins with scan 1 (80) from left to right, its direction reverses at the end of scan 1, scan 2 (82) is then carried out right to left, scan 3 (84) again left to right, scan 4 (86) right to left, and so on. The width of each x-scan has been shown in FIG. 9 as w; this is for the purpose of illustration only, as the illumination region is hexagonal and the overlap between scans 1 and 3 (and between scans 2 and 4) is seamless as before, w thus being effective scan width as defined previously. Simultaneously with the scanning in the x-direction, the substrate and the mask are scanned continuously in the y-direction. The y-scan rate is such that during the time it takes the substrate to complete one left-to-right scan and one right-to-left scan, the substrate moves in the y-direction by the effective scan width w. Thus, if $v_x$ and $v_y$ are, respectively, the x- and y-scan velocities of the substrate, $l_x$ the total x-scan length, and $t_x$ and $t_y$ the time durations, respectively, to scan lengths $l_x$ and w in x- and y-directions, then, since $t_y = 2 t_x$, $v_y$ is related to $v_x$ by $$v_y/v_x = w/2\, l_x.$$

The x- and y-scanning rates of the mask are $Mv_x$ and $Mv_y$, respectively, M being, as before, the reduction ratio of the projection lens assembly.

Figure 2:
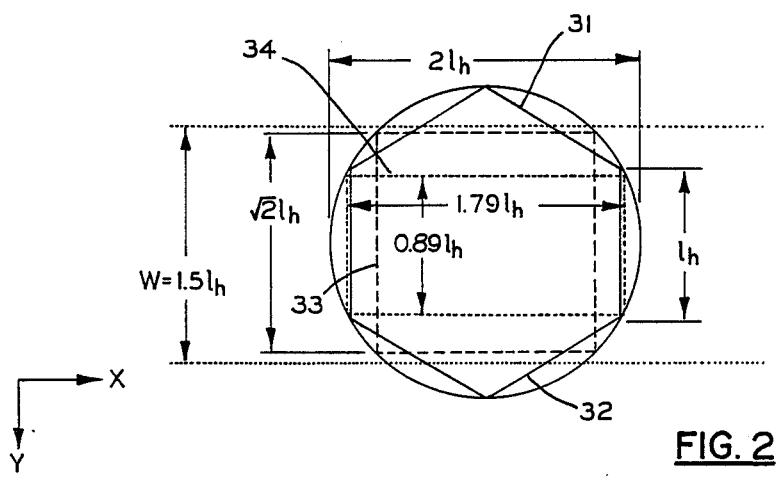
FIG. 2 is a diagram showing the effective circular and square image field sizes of the projection lens, the hexagonal illumination region on the substrate, and the effective scan width.

Before proceeding to an example of the preferred embodiment according to the invention, its key advantages may here be summarized. The scan and repeat mechanism not only makes it possible to obtain high resolution, but also enables one to expose much larger chips than would be possible with prior-art high resolution lithography systems of the stepper type employing the same projection lens assembly. Referring to FIG. 2, let us consider a projection lens assembly with a circular field size, 31, of diameter 2 $l_h$. The largest rectangular chip of aspect ratio 1:2 (34 in FIG. 2) that can be exposed with such a lens in the prior-art stepper lithography system has a width of 2 $l_h \sin(\tan^{-1} 0.5) = 0.89\, l_h$. In comparison, the scan and repeat system described herein can expose chips of width w=1.5 $l_h$ without moving the mask in the y-direction. If the scan and repeat system is designed with provision for mask movement in the y-direction, chips of widths as large as the substrate width can be exposed.

In the above description of the preferred embodiment we have considered a refractive projection subsystem which is a lens assembly consisting of several individual lens elements. In alternative embodiments, some or all of the optical components in the projection subsystem may be reflective elements, e.g., dielectric or metallic mirrors. One such alternative embodiment may use X-ray illuminatin and an X-ray projection subsystem, designed with a certain object-to-image ratio and consisting of X-ray mirrors. The scan and repeat lithography concept with seamless dosage delivery by complementary overlapping polygon exposure, as described in this invention, is also applicable to various proximity lithography systems, i.e., systems in which the projection subsystem consists of a certain spacing separating the mask and the substrate and image projection takes the form of shadow printing. For example, a scan and repeat X-ray proximity lithography system employing this invention may have a polygon-shaped X-ray beam which is used for shadow printing a mask pattern onto a substrate, the mask and substrate being held in proximity and scanned simultaneously with appropriate overlap between adjacent scans as taught in this invention to produce seamless and uniform exposure of the substrate. Similarly, an electron beam lithography system using proximity printing may employ the scan and repeat concept of this invention by having an electron beam with a polygonal cross-section, by scanning the mask and substrate in synchronism, and by having complementary exposures through overlapping adjacent scans, thus ensuring seamless and uniform dosage over the entire substrate. In a similar fashion, this invention is also applicable to a scan and repeat optical contact or proximity lithography system. Finally, the concept of scan and repeat lithography with complementary edge illumination by adjacent scans is applicable to maskless lithography systems in which a polygonal beam may be focused on the substratee which may then be moved in two dimensions to produce the desired pattern on the substrate.

METHOD OF OPERATION

The invention carries out the method for providing a scan and repeat lithography system for high resolution, large-field, high-speed lithography, using the following steps:

1. Providing a substrate stage for holding the substrate, and capable of scanning the substrate in one dimension, and capable of moving laterally in a direction perpendicular to the scan direction;
2. Providing a mask stage for holding the mask, and capable of scanning the mask in the same dimension as the substrate stage;
3. Providing a projection subsystem which has a certain reduction ratio M, which is designed to produce the required resolution, and which has a circular image field size of a diameter which may be less than the length of a chip on the substrate, but not less than the width of the chip;
4. Providing an illumination subsystem which produces radiation with wavelength and intensity characteristics as required by the projection system, and which produces on the substrate an illuminated region in the shape of a regular hexagon of side $l_h$ that can be inscribed within the circular image field;
5. Providing a mask which has a certain number, m, of complete, patterned chip fields, and additional patterned areas that fall within the hexagonal illuminated region on the mask;
6. Scanning the substrate across the hexagonal substrate illumination region at a velocity $v_x$, and simultaneously scanning the mask in a parallel direction across the hexagonal mask illumination region at a velocity $Mv_x$;
7. Stopping the substrate and mask scanning momentarily upon completion of the exposure of m chips, resetting the mask stage to its starting position, and resuming the scanning of the substrate and mask stages;
8. Stopping the substrate and mask scanning upon completion of a scan across the width of the substrate, moving the substrate by a distance equal to 1.5 $l_h$ in a direction perpendicular to the scan direction, and resuming the scanning of the substrate and the mask stages in directions opposite to their respective directions in steps 6 and 7;
9. Aligning the substrate and mask stages at the desired chip interval during steps 6–8; and
10. Repeating steps 6–9 until exposure of the entire substrate is completed.

EXAMPLE

An example of the design of a scan and repeat lithography system according to the invention will now be given. The hexagonal illumination region on the substrate, shown as 32 in FIG. 2, is such that $\sqrt{2}\, l_h$, the length of a side of the effective square field size (33 in FIG. 2) of the projection lens assemby (26 in FIG. 1) is 10.0 mm. Then, $l_h$, the length of a side of the regular hexagon, is $10.0/\sqrt{2}$ mm = 7.07 mm, and the circular image field size (31 in FIG. 2) of the projection lens assembly has a diameter 2 $l_h = 2 \times 7.07$ mm = 14.1 mm. The projection lens assembly has a reduction ratio of 5. The illumination region on the mask is a regular hexagon of side $5 \times 7.07$ mm = 35.4 mm.

The substrate stage is designed to hold 200 mm diameter semiconductor wafers. The substrate stage scans in the x-direction at a velocity $v_x = 100$ mm/sec. The length of each x-scan is determined by the segment of the substrate being scanned, and equals the substrate diameter (200 mm) for scans at and near the center of the substrate. At the end of the first x-scan (50 in FIG. 5), the substrate stage moves in the y-direction by a distance equal to the effective scan width w (52 in FIG. 5), which is designed to be 1.5 $l_h = 1.5 \times 7.07$ mm = 10.6 mm. After the y-movement by w (=10.6 mm), the substrate scans in the negative x-direction (54 in FIG. 5), at the end of which another y-movement by 10.6 mm is given (56 in FIG. 5), and another x-scan (58 in FIG. 5) begins in the x-direction. This process is continued until the complete substrate is scanned. Simultaneously with substrate scanning, the mask stage scans at a velocity 5 $v_x = 500$ mm/sec, and it reverses its direction whenever the substrate stage reverses its direction.

Figure 7:
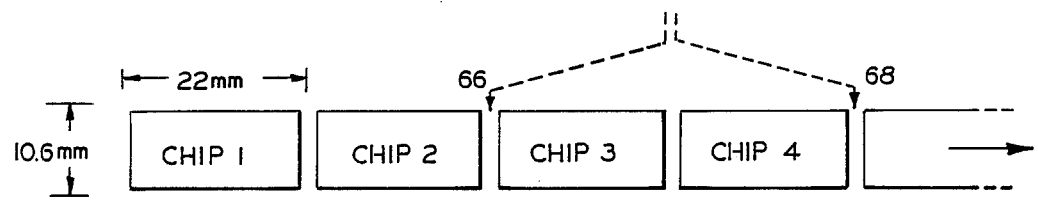
FIG. 7 illustrates the chip fields on the substrate and indicates the locations where resetting of the mask stage takes place.

Each chip field on the substrate is taken to be, in this example, 10.6 mm wide (same as the effective scan width, w) and 22.0 mm long (see FIG. 7). The chip fields on the mask are then 5 times larger, i.e., 53.0 mm $\times$ 110.0 mm. The mask blank is approximately 125 mm wide and 250 mm long, and patterned with 4 complete chip fields arranged as shown in FIG. 8A. Note that the dimensions of a chip field, whether on the substrate or on the mask, are defined so as to include the kerf, i.e., the spacing between adjacent fields.

The mask scans only in the x-direction, and its scan length is the length of two mask chip fields (220 mm). After the mask has scanned a length of 220 mm, both the mask and the substrate stages are momentarily stopped, the mask stage is reset to its original position (see FIG. 7), and the synchronous scanning of the mask and the substrate is resumed. After scanning two more chip fields, the mask stage is again reset, and the above process continues during the exposure of the entire substrate.

The projection lens assembly is designed for operation at a wavelength of $\lambda = 248.4 \pm 0.003$ nm from a line-narrowed and frequency-stabilized krypton fluoride (KrF) excimer laser source. The numerical aperture of the projection lens assembly on the substrate side is $NA_w = 0.46$; it is designed to give a resolution value R of 0.35 micron using $$R = k\lambda/NA_w$$

in which the value of k is taken to be 0.65. With a reduction ratio $M = 5$, the numerical aperture of the projection lens assembly on the mask side (see FIG. 1) is $$NA_m = M \times NA_w = 0.092.$$

The illumination of the mask is such that the partial coherence factor $\sigma = 0.6$. Thus, the effective numerical aperture of the illumination on the mask is $$NA_{ms} = NA_m/\sigma = 0.153.$$

The size of the effective source plane (21 in FIG. 1) is designed to be the same as the hexagonal illumination region on the substrate, i.e., 1/M of the size of the hexagonal illumination region on the mask. Thus, the effective numerical aperture of the source, $NA_s$, at the source plane is designed to be $$NA_s = M \times NA_{ms} = 0.767.$$

The excimer laser source is pulsed at a repetition rate of 204 Hz. (The choice of 204 Hz for the laser pulse repetition rate will be explained below in connection with the wafer throughput calculation.) The scanning of the substrate stage is carried out in steps synchronized with the laser pulses; thus, with each firing of a laser pulse, the substrate stage moves 0.49 mm (which gives an effective substrate scan velocity of 100 mm/sec). Similarly, the mask stage scanning, in steps of 2.45 mm each, is also synchronized with the laser pulses.

The wafer throughput, i.e., the number of wafers exposed per hour, in such a scan and repeat lithography system will now be calculated. The hexagonal illumination region on the substrate has a width $l_d$ (for example, b-c in FIG. 3) given by $$l_d = \sqrt{3}\, l_h = 12.2 \text{ mm}.$$

For a substrate scan velocity of $v_x = 10$ cm/sec, the hexagon width $l_d$ is scanned in a time $t_d$ given by $$t_d = l_d/v_x = \sqrt{3}\, l_h/v_x = 0.122 \text{ sec}.$$

With a laser pulse repetition rate of $f = 204$ Hz, the number of pulses fired during the time it takes the substrate to scan a distance $l_d$ is $$N = f t_d = \sqrt{3}\, l_h f/v_x = 25.$$

Thus, each point on the wafer receives the cumulative exposure from $N = 25$ laser pulses. (It should now be clear that the laser pulse repetition rate was chosen to be 204 Hz, rather than, say, 200 Hz, in order to make N an integer.) The laser pulse energy density $E_w$ (mJ/cm$^2$) at the wafer is determined in such way that the total exposure dose received is equal to the sensitivity $D_s$ (mJ/cm$^2$) of the photoresist used; thus, $$D_s = NE_w = \sqrt{3}\, l_h f E_w/v_x = 25\, E_w,$$

or $$E_w = D_s/N = D_s v_x/\sqrt{3}\, l_h f = D_s/25.$$

For example, using a photoresist of sensitivity $D_s = 50$ mJ/cm$^2$, the laser pulse energy density at the wafer must be $E_w = 2$ mJ/cm$^2$. Since the area A of the hexagonal illumination region on the wafer is given by $$A = l_h \times \sqrt{3}\, l_h + 0.5\, l_h \times \sqrt{3}\, l_h = 1.5\sqrt{3}\, l_h^2 = 1.3 \text{ cm}^2,$$

the energy per pulse at the wafer, $e_w$, is $$e_w = AE_w = 1.5\, l_h D_s v_x/f = 2.6 \text{ mJ}.$$

Hence, $p_w$, the power incident on the wafer is $$p_w = f e_w = 1.5\, l_h D_s v_x = 0.53 \text{ W}.$$

Taking an effective transfer efficiency of $\eta = 20\%$ for the complete optical system between the laser and the substrate, the power emitted by the laser is $$p_L = p_w/\eta = 1.5\, l_h D_s v_x/\eta = 2.65 \text{ W}.$$

Using the equations derived above, various quantities such as the laser power required and the number of overlapping pulses at each point may be calculated for any other set of parameters including resist sensitivity, scan velocity, pulse repetition rate and size of the illumination region. For example, a repetition rate of 303 Hz, with all other parameters as before, gives $N = 37$, $E_w = 1.35$ mJ/cm$^2$ and $e_w = 1.76$ mJ, the power from the laser still being $p_L = 2.65$ W. If a resist sensitivity $D_s = 10$ mJ/cm$_2$ is used, then, with $f = 204$ Hz, we get $N = 25$ as calculated previously, but now $E_w = 0.4$ mJ/cm$^2$, $e_w = 0.52$ mJ, $p_w = 106$ mW and $p_L = 0.53$ W. A complete set of such results for resist sensitivities of 10, 50 and 100 mJ/cm$^2$ and laser pulse repetition rates of 98, 204 and 303 Hz is presented as Table I in FIG. 10.

The total scan time required to expose wafers of various sizes is calculated as follows. Since the scanning is done at a rate of $v_x (= 100$ mm/sec) and the effective scan width is $w (= 1.5\, l_h = 10.6$ mm), the effective area exposed each second is $$a = w v_x = 1.5\, l_h v_x = 10.6 \text{ cm}^2.$$

Therefore, a wafer of diameter $d_w$, which has an area $A_w = \pi d_w^2/4$, will be exposed in a time duration $t_e$ given by $$t_e = A_w/a = \pi d_w^2/4 w v_x = \pi d_w^2/6\, l_h v_x.$$

The areas of wafers of diameter 125 mm, 150 mm and 200 mm are, respectively, 122.7 cm$^2$, 176.7 cm$^2$, and 314.2 cm$^2$. Hence, the total exposure times for 125 mm, 150 mm and 200 mm diameter wafers are, respectively, $t_{e,125} = 11.6$ sec, $t_{e,150} = 16.7$ sec and $t_{e,200} = 29.6$ sec.

The number of chips, $n_c$, of width $w (= 10.6$ mm) and length $l_c (= 22.0$ mm) on wafers of different diameters is calculated by dividing the wafer area $A_w$ by the chip area, $A_c (= 2.33$ cm$^2$). Thus, $$n_c = A_w/A_c = (\pi d_w^2/4)/w l_c = (\pi d_w^2/4)/1.5\, l_h l_c = \pi d_w^2/6\, l_h l_c.$$

For 125 mm, 150 mm and 200 mm diameter wafers, the value of $n_c$ is 52, 75 and 134, respectively.

The wafer throughput is now obtained as follows. We have $t_e$ = total exposure time per wafer, and $n_c$ = number of chips per wafer.

In addition, let $t_a$ = alignment time per alignment event, $n_a$ indicate that alignment is done once every $n_a$ chips, $t_{OH}$ = total overhead time per wafer (includes load, unload, level, focus, settle and stops)

$W$ = wafer throughput per hour.

Then, the total time taken to cycle a wafer through the lithography machine is given by $$t_t = t_e + t_{OH} + t_a n_c/n_a.$$

Hence, the wafer throughput per hour is $$W = 3600/t_t = 3600/(t_e + t_{OH} + t_a n_c/n_a)$$

or $$W = 3600/(\pi d_w^2/6\, l_h v_x + t_{OH} + t_a n_c/n_a).$$

The above general expression for wafer throughput may be used with any set of values for the parameters $l_h$, $v_x$, $n_c$, $t_a$, $n_a$, $d_w$ and $t_{OH}$ to produce the wafer throughput result for the given conditions being considered. As an example, for wafers of diameter $d_w = 150$ mm, with alignment being done every fourth chip (i.e., $n_a = 4$), and using $l_h = 7.07$ mm, $v_x = 100$ mm/sec, $n_c/n_a = 19$, $t_a = 0.4$ sec and $t_{OH} = 20$ sec, we obtain $W = 81.3$ wafers/hr. If alignment is done every tenth chip, we use $n_c/n_a = 8$ and get $W = 90.2$ wafers/hr. For site-by-site alignment (i.e. $n_a = 1$), $W = 54.0$ wafers/hr. In Table II in FIG. 11 we give a complete set of wafer throughput values for wafer diameters of 125, 150 and 200 mm with three different alignment conditions in each case.

What is claimed is:

1. A high resolution, high exposure speed, large effective field size scan and repeat lithography system for producing precise images of a pattern that is present on a mask onto a substrate, comprising:
   (a) a substrate stage capable of scanning a substrate in one dimension and, when not scanning in that dimension, capable of moving laterally in a direction perpendicular to the scan direction so as to position the substrate for another scan; said substrate stage thus being capable of exposing the full substrate by breaking up the substrate are into a certain number of parallel strips, and exposing each of said strips by scanning the length of the strip across a fixed illumination region;
   (b) a mask stage capable of scanning in the same dimension as, and synchronized with, the substrate stage, at a speed equal to the substrate stage scanning speed multiplied by a certain ratio M;
   (c) an illumination subsystem having the desired characteristics of wavelength and intensity distribution, having an effective source plane in the shape of a polygon, and capable of uniformly illuminating a polygon-shaped region on the mask;
   (d) a projection subsystem for imaging the said polygon-shaped illuminated region on the mask onto the substrate, having an object-to-image reduction ratio M, having the desired image resolution, and having an image field in the shape of a polygon and of an area smaller than the desired effective image field size of the said lithography system; and
   (e) control means to operatively interrelate said substrate stage, said mask stage and said illumination subsystem, and to provide complementary exposures in an overlap region between the areas exposed by adjacent scans in such a way that the exposure dose distribution received in the overlap region is seamless, and such that the exposure dose delivered across the entire substrate is uniform.

2. A scan and repeat lithography system according to claim 1, wherein:
   (a) said illumination subsystem has an effective source plane in the shape of a regular hexagon, and illuminates a regular-hexagon-shaped region on the mask, and said regular-hexagon-shaped region is so oriented that two of its sides are perpendicular to the scan direction;
   (b) said projection subsystem has an image field in the shape of a regular hexagon, and said regular hexagon is so oriented that two of its sides are perpendicular to the scan direction; and
   (c) the effective width, w, of each substrate scan, as defined by the lateral separation between the center lines of two adjacent scans, is given by $$w = 1.5\, l_h,$$

where $l_h$ is the length of each side of the regular-hexagon-shaped image field on the substrate.

3. A scan and repeat lithography system according to claim 2, wherein said effective width of each substrate scan is equal to the width of each chip on the substrate, where the width of each chip on the substrate is defined as the periodic distance at which the chips on the substrate repeat in the direction perpendicular to the scan direction.

4. A scan and repeat lithography system according to claim 1, wherein:
   (a) the direction of the substrate travel in any scan is opposite to the direction of the substrate travel in an adjacent scan; and
   (b) the direction of the mask travel in any scan is opposite to the direction of the mask travel in an adjacent scan.

5. A scan and repeat lithography system according to claim 1, wherein:
   (a) the number of chip fields on the mask in the direction of scan, equal to a certain number $N_m$, is less than the number of chips in the longest scan on the substrate; and
   (b) said control means monitors scanning and, upon determination of synchronous scanning by the substrate and mask stages of every $N_m$ chips, provides for the substrate stage to pause momentarily, the mask stage to reset to its original position, and for synchronous scanning of the substrate and mask stages to resume.

6. A scan and repeat lithography system according to claim 1, wherein said illumination subsystem provides radiation that is pulsed with a certain repetition frequency.

7. A scan and repeat lithography system according to claim 6, wherein said pulsed radiation is emitted by an excimer laser.

8. A scan and repeat lithography system according to claim 1, wherein said illumination subsystem provides X-ray illumination of a polygon-shaped region on the mask.

9. A scan and repeat lithography system according to claim 1, wherein said illumination subsystem provides electron beam illumination of a polygon-shaped region on the mask.

10. A scan and repeat lithography system according to claim 6, wherein:
  (a) the scanning of the substrate stage is made up of a multiple of a certain unit movement of length $d_s$, such that $$d_s = v_x/f,$$

where $v_x$ is the effective substrate scan speed and $f$ is the pulse repetition frequency of the illumination subsystem; and
  (b) the mask stage scanning is made up of a multiple of a unit movement of length $d_m$, such that $$d_m = M d_s.$$

11. A scan and repeat lithography system according to claim 10, wherein said control means provides for realigning the mask and the wafer with respect to each other periodically, determining the interval between successive realignments by monitoring during said interval the number of pulses emitted by said illumination system.

12. A scan and repeat lithography system according to claim 11, wherein the number of pulses emitted by said illumination system during said interval between successive realignments is a multiple of $l_c f/v_x$, where $l_c$ is the length of a chip on the substrate in the scan direction.

13. A scan and repeat lithography system according to claim 1, wherein said mask stage, in addition to being capable of scanning in said manner, is also capable of moving laterally in a direction perpendicular to the scan direction.

14. A scan and repeat lithography system according to claim 11, wherein;
  (a) said object-to-image reduction ratio of said projection subsystem is 5; and
  (b) said ratio of mask scanning speed to substrate scanning speed is 5.

15. A scan and repeat lithography system according to claim 1, wherein;
  (a) said object-to-image reduction ratio of said projection subsystem is 1; and,
  (b) said ratio of mask scanning speed to substrate scanning speed is 1.

16. A scan and repeat lithography system according to claim 1, wherein the wavelength of said illumination system lies in the region 251±3 nm.

17. The method for providing a scan and repeat lithography system for high-resolution, large-field, high-speed lithography, characterized by the following steps:
  (a) Providing a substrate stage for holding the substrate, and capable of scanning the substrate in one dimension, and capable of moving laterally in a direction perpendicular to the scan direction;
  (b) Providing a mask stage for holding the mask, and capable of scanning the mask in the same dimension as the substrate stage;
  (c) Providing an illumination subsystem having the desired characteristics of wavelength and intensity distribution, having aan effective source plane in the shape of a polygon, and capable of uniformly illuminating a polygon-shaped region on the mask;
  (d) Providing a projection subsystem for imaging the said polygon-shaped illuminated region on the mask on to the substrate, having an object-to-image reduction ratio M, having the desired image resolution, and having an image field in the shape of a polygon and of an area smaller than the desired effective image field size of the said lithography system;
  (e) Providing a mask which has a certain number of complete, patterned chip fields, and additional patterned areas that fall within the hexagonal illuminated region on the mask;
  (f) Scanning the substrate across the polygonal substrate illumination region at a certain velocity $v_x$, and simultaneously scanning the mask in a parallel direction across the polygonal mask illumination region at a velocity $Mv_x$;
  (g) Stopping the scanning of the substrate and mask stages upon completion of a scan across the total length of the substrate along the direction of scan, moving the substrate by a certain distance in a direction perpendicular to the scan direction, and resuming the scanning of the substrate and the mask stages in directions opposite to their respective directions in step (f);
  (h) Providing complementary exposures in an overlap region between the areas exposed by adjacent scans in such a way that a seam in the exposure dose distribution received on the substrate is absent between the said scans, and such that the exposure dose delivered across the entire substrate is uniform;
  (i) Repeating steps (f)–(h) until exposure of the entire substrate is completed.

18. The method according to claim 17, further including the step of aligning the substrate and mask stages at the desired interval during steps (f)–(i).

19. The method according to claim 17, further including the step of repetitively stopping the scanning of the substrate and mask stages momentarily upon completion of the exposure of a certain number of chips less than the number of chips on the longest substrate scan, resetting the mask stage to its starting position, and resuming the scanning of the substrate and mask stages.

20. A high resolution, high exposure speed, large effective field size scan and repeat lithography system for producing precise images of a pattern that is present on a mask onto a substrate, comprising:
  (a) a substrate stage capable of scanning a substrate in a certain dimension x, and simultaneously capable of scanning the substrate in a direction y which is perpendicular to the direction x, so as to enable the substrate stage, while it is completing one scan in the x-dimension, to simultaneously move laterally in the y-direction and thus position the substrate for another scan in the x-dimension; said substrate stage thus being capable of exposing the full substrate by breaking up the substrate are into a certain number of strips, and exposing each of said strips by scanning the length of the strip across a fixed illumination region;
(b) a mask stage capable of scanning in the same two dimensions as, and synchronized with, the substrate stage, at speeds in the x- and y-directions which are faster than the corresponding substrate stage scanning speeds by a certain ratio M;
(c) an illumination subsystem having the desired characteristics of wavelength and intensity distribution, having an effective source plane in the shape of a polygon, and capable of uniformly illuminating a polygon-shaped region on the mask;
(d) a projection subsystem for imaging the said polygon-shaped illuminated region on the mask on to the substrate, having an object-to-image reduction ratio M, having the desired image resolution, and having an image field in the shape of a polygon and of an area smaller than the desired effective image field size of the said lithography system; and
(e) control means to operatively interrelate said substrate stage, said mask stage and said illumination subsystem, and to provide complementary exposures in an overlap region between the areas exposed by adjacent scans in such a way that the exposure dose distribution received in the overlap region is seamless, and such that the exposure dose delivered across the entire substrate is uniform.

21. The method for providing a scan and repeat lithography system for high-resolution, large-field, high-speed lithography, characterized by the following steps:
(a) Providing a substrate stage for holding the substrate, and capable of scanning the substrate simultaneously in certain two dimensions x and y;
(b) Providing a mask stage for holding the mask, and capable of simultaneously scanning the mask in the x- and y-dimensions;
(c) Providing an illumination subsystem having the desired characteristics of wavelength and intensity distribution, having an effective source plane in the shape of a polygon, and capable of uniformly illuminating a polygon-shaped region on the mask;
(d) Providing a projection subsystem for imaging the said polygon-shaped illuminated region on the mask on to the substrate, having an object-to-image reduction ratio M, having the desired image resolution, and having an image field in the shape of a polygon and of an area smaller than the desired effective image field size of the said lithography system;
(e) Scanning the substrate simultaneously in the x- and y-dimensions across the polygonal substrate illumination region at certain velocities in the two dimensions, and simultaneously scanning the mask in the x- and y-dimensions across the polygonal mask illumination region at velocities which are equal to the corresponding substrate stage scanning velocities multiplied by M;
(f) Stopping the scanning of the substrate and mask stages upon completion of a scan across the total length of the substrate in the x-dimension, reversing the direction of the scan in the x-dimension, and resuming the simultaneous two-dimensional scanning of the substrate and the mask stages as in step (e);
(g) Providing complementary exposurees in an overlap region between the areas exposed by adjacent parallel scans in such a way that a seam in the exposure dose distribution received on the substrate is absent between the said scans, and such that the exposure dose delivered across the entire substrate is uniform; and
(h) Repeating steps (e)–(g) until exposure of the entire substrate is completed.

22. The method according to claim 21, further including the step of aligning the substrate and mask stages at the desired interval during steps (e)–(h).

* * * * *

(12) EX PARTE REEXAMINATION CERTIFICATE (7099th)
United States Patent
Jain

(10) Number: US 4,924,257 C1
(45) Certificate Issued: Oct. 13, 2009

(54) SCAN AND REPEAT HIGH RESOLUTION PROJECTION LITHOGRAPHY SYSTEM

(75) Inventor: Kantilal Jain, Briarcliff Manor, NY (US)

(73) Assignee: Anvik Corporation, Elmsford, NY (US)

Reexamination Request:
No. 90/008,881, Oct. 16, 2007

Reexamination Certificate for:
Patent No.: 4,924,257
Issued: May 8, 1990
Appl. No.: 07/253,717
Filed: Oct. 5, 1988

(51) Int. Cl.
*G03F 7/20* (2006.01)

(52) U.S. Cl. .................. 355/53; 250/492.2; 355/77
(58) Field of Classification Search .................. None
See application file for complete search history.

(56) References Cited

U.S. PATENT DOCUMENTS

| | | |
|---|---|---|
| 1,717,781 A | 6/1929 | Ives |
| 3,224,327 A | 12/1965 | Schulze |
| 3,510,349 A | 5/1970 | Jones |
| 3,537,373 A | 11/1970 | Land |
| 3,538,828 A | 11/1970 | Genovese |
| 3,541,253 A | 11/1970 | Shonnard |
| 3,544,190 A | 12/1970 | Moorhusen |
| 3,584,950 A | 6/1971 | Gundlach |
| 3,584,952 A | 6/1971 | Gundlach |
| 3,592,542 A | 7/1971 | Kaüfer |

(Continued)

FOREIGN PATENT DOCUMENTS

| | | |
|---|---|---|
| DE | 24 13 551 | 9/1975 |
| DE | 3328578 A1 | 4/1984 |
| DE | 3430752 A1 | 3/1985 |
| DE | 3503273 A1 | 8/1985 |
| DE | 3643578 A1 | 7/1987 |

(Continued)

OTHER PUBLICATIONS

Cuthbert, J. D. (Aug. 1977). "Optical Projection Printing," *Solid State Technology* 20(8):59–69.
Bruning, J. H. (Apr. 1981). "Optical Imaging for Microfabrication," *Semiconductor International* pp. 137–156.

(Continued)

*Primary Examiner*—James Menefee

(57) ABSTRACT

This scan and repeat lithography system has high resolution capability, large effective image field size, and high substrate exposure speed, and comprises: (a) a substrate stage capable of scanning a substrate in one dimension and, when not scanning in said dimension, capable of moving laterally in a direction perpendicular to the scan direction so as to position the substrate for another scan; the substrate stage exposing the full substrate by breaking up the substrate area into parallel strips, and exposing each of the strips by scanning the length of the strip across a fixed illumination region; (b) a mask stage capable of scanning in the same direction as, and synchronized with, the substrate stage, at a speed faster than the substrate stage scanning speed by a certain ratio M; (c) an illumination subsystem having an effective source plane in the shape of a polygon, and capable of uniformly illuminating a polygon-shaped region on the mask; (d) a projection subsystem having an object-to-image reduction ratio M, and having a polygon-shaped image field of an area smaller than the desired effective image field size of the lithography system; and (e) provision of complementary exposures in an overlap region between the areas exposed by adjacent scans in such a way that a seam in the exposure dose distribution received on the substrate is absent between the scans, and such that the exposure dose delivered across the entire substance is uniform.

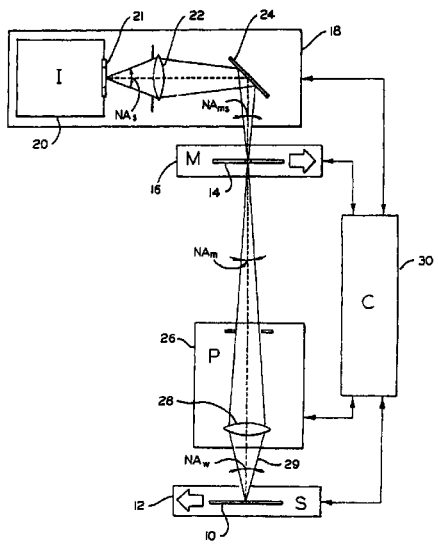

U.S. PATENT DOCUMENTS

| | | |
|---|---|---|
| 3,609,024 A | 9/1971 | Suzuki |
| 3,622,324 A | 11/1971 | Lewis |
| 3,670,632 A | 6/1972 | Stanton |
| 3,709,602 A | 1/1973 | Satomi |
| 3,711,721 A | 1/1973 | Hansen |
| 3,716,296 A | 2/1973 | Springer |
| 3,722,980 A | 3/1973 | Craig |
| 3,785,732 A | 1/1974 | Yanagawa |
| 3,819,265 A | 6/1974 | Feldman et al. |
| 3,864,032 A | 2/1975 | Yanagawa |
| 3,884,573 A | 5/1975 | Franklin |
| 3,917,794 A | 11/1975 | Akagi |
| 4,012,636 A | 3/1977 | Engdahl |
| 4,021,239 A | 5/1977 | Ogawa |
| 4,023,126 A | 5/1977 | Schlafer |
| 4,052,603 A | 10/1977 | Karlson |
| 4,057,347 A | 11/1977 | Moriyama |
| 4,068,947 A | 1/1978 | Buckley |
| 4,128,331 A | 12/1978 | Nakamura |
| 4,149,799 A | 4/1979 | Poné |
| 4,153,371 A | 5/1979 | Koizumi |
| 4,162,830 A | 7/1979 | Gee |
| 4,169,230 A | 9/1979 | Bohlen |
| 4,171,870 A | 10/1979 | Bruning |
| 4,178,615 A | 12/1979 | Shimooka |
| 4,206,998 A | 6/1980 | Tokuda |
| 4,215,933 A | 8/1980 | Feneberg |
| 4,239,379 A | 12/1980 | Tomita |
| 4,241,390 A | 12/1980 | Markle |
| 4,264,163 A | 4/1981 | Hickok |
| 4,293,184 A | 10/1981 | Minoura |
| 4,302,079 A | 11/1981 | White |
| 4,328,553 A | 5/1982 | Fredriksen |
| 4,332,473 A | 6/1982 | Ono |
| 4,362,384 A | 12/1982 | Engelbrecht |
| 4,388,389 A | 6/1983 | Gold |
| 4,398,824 A | 8/1983 | Feldman |
| 4,408,875 A | 10/1983 | Majima |
| 4,417,809 A | 11/1983 | Nötzel |
| 4,426,584 A | 1/1984 | Bohlen |
| 4,444,506 A | 4/1984 | Isono |
| 4,458,994 A | 7/1984 | Jain |
| 4,473,636 A | 9/1984 | Marling |
| 4,474,459 A | 10/1984 | Tokumaru |
| 4,474,864 A | 10/1984 | Chow |
| 4,475,122 A | 10/1984 | Green |
| 4,496,956 A | 1/1985 | Mitsuka |
| 4,504,558 A | 3/1985 | Bohlen |
| 4,511,234 A | 4/1985 | Andresen |
| 4,525,065 A | 6/1985 | Takagi |
| 4,550,374 A | 10/1985 | Meshman |
| 4,573,791 A | 3/1986 | Phillips |
| 4,589,769 A | 5/1986 | Matsuki |
| 4,591,540 A | 5/1986 | Bohlen |
| 4,631,416 A | 12/1986 | Trutna |
| 4,685,807 A | 8/1987 | Picard |
| 4,688,932 A | 8/1987 | Suzuki |
| 4,697,087 A | 9/1987 | Wu |
| 4,701,608 A | 10/1987 | Morita |
| 4,702,590 A | 10/1987 | Usami |
| 4,707,118 A | 11/1987 | Terashita |
| 4,708,466 A | 11/1987 | Isohata et al. |
| 4,727,381 A | 2/1988 | Bille |
| 4,734,745 A | 3/1988 | Ohta |
| 4,736,225 A | 4/1988 | Tanaka |
| 4,737,858 A | 4/1988 | DeBaryshe |
| 4,748,477 A | 5/1988 | Isohata |
| 4,748,478 A | 5/1988 | Suwa |
| 4,749,867 A | 6/1988 | Matsushita |
| 4,758,091 A | 7/1988 | Bodine |
| 4,769,680 A | 9/1988 | Resor |
| 4,775,877 A | 10/1988 | Kosugi |
| 4,778,233 A | 10/1988 | Christenson |
| 4,780,606 A | 10/1988 | Morita et al. |
| 4,780,617 A | 10/1988 | Umatate |
| 4,785,192 A | 11/1988 | Bruning |
| 4,796,038 A | 1/1989 | Allen |
| 4,804,611 A | 2/1989 | Geis |
| 4,806,987 A | 2/1989 | Mori |
| 4,812,879 A | 3/1989 | Suzuki |
| 4,822,975 A | 4/1989 | Torigoe |
| 4,825,086 A | 4/1989 | Mueller |
| 4,835,704 A | 5/1989 | Eichelberger |
| 4,843,563 A | 6/1989 | Takahashi |
| 4,844,568 A | 7/1989 | Suzuki |
| 4,847,191 A | 7/1989 | Grzeskowiak |
| 4,869,998 A | 9/1989 | Eccles |
| 4,872,035 A | 10/1989 | Miyake |
| 4,878,086 A | 10/1989 | Isohata |
| 4,879,605 A | 11/1989 | Warkentin |
| 4,886,958 A | 12/1989 | Merryman |
| 4,891,094 A | 1/1990 | Waldo |
| 4,896,169 A | 1/1990 | Kuwabara |
| 4,901,109 A | 2/1990 | Mitome |
| 4,901,656 A | 2/1990 | Yoshida |
| 4,931,380 A | 6/1990 | Owens |
| 4,933,754 A | 6/1990 | Reed |
| 4,940,641 A | 7/1990 | Pavone |
| 4,952,858 A | 8/1990 | Galburt |
| 4,962,318 A | 10/1990 | Nishi |
| 4,964,720 A | 10/1990 | Torigoe |
| 4,978,994 A | 12/1990 | Shumizu |
| 4,982,227 A | 1/1991 | Suzuki |
| 4,984,015 A | 1/1991 | Okino |
| 4,989,032 A | 1/1991 | Hull |
| 4,989,033 A | 1/1991 | Yamashita |
| 5,041,868 A | 8/1991 | Suzuki |
| 5,049,902 A | 9/1991 | Duke |
| 5,050,111 A | 9/1991 | Ayata |
| 5,051,341 A | 9/1991 | Muenter |
| 5,053,619 A | 10/1991 | Arimoto |
| RE33,836 E | 3/1992 | Resor |
| 5,111,240 A | 5/1992 | Boettiger |
| 5,132,195 A | 7/1992 | Pool |
| 5,134,495 A | 7/1992 | Frazier |
| 5,194,893 A | 3/1993 | Nishi |
| 5,208,818 A | 5/1993 | Gelbart |
| 5,214,519 A | 5/1993 | Faulhaber |
| 5,218,402 A | 6/1993 | Beaulieu |
| 5,227,839 A | 7/1993 | Allen |
| 5,235,349 A | 8/1993 | Yamazaki |
| 5,258,856 A | 11/1993 | Shinada |
| 5,285,236 A | 2/1994 | Jain |
| 5,286,963 A | 2/1994 | Torigoe |
| 5,289,231 A | 2/1994 | Magome. |
| 5,298,761 A | 3/1994 | Aoki |
| 5,298,939 A | 3/1994 | Swanson |
| 5,310,628 A | 5/1994 | Muenter |
| 5,357,273 A | 10/1994 | Curry |
| 5,398,052 A | 3/1995 | Isaka |
| 5,437,946 A | 8/1995 | McCoy |
| 5,448,332 A | 9/1995 | Sakakibara |
| 5,448,336 A | 9/1995 | Shiraishi |
| 5,473,410 A | 12/1995 | Nishi |
| 5,477,304 A | 12/1995 | Nishi |
| 5,506,684 A | 4/1996 | Ota |
| 5,523,574 A | 6/1996 | Hamada |
| 5,528,027 A | 6/1996 | Mizutani |
| 5,534,970 A | 7/1996 | Nakashima |
| 5,591,958 A | 1/1997 | Nishi |
| 5,617,182 A | 4/1997 | Wakamoto |

| Patent No. | Kind | Date | Name |
|---|---|---|---|
| 5,627,627 | A | 5/1997 | Suzuki |
| 5,633,720 | A | 5/1997 | Takahashi |
| 5,635,976 | A | 6/1997 | Thuren |
| 5,638,211 | A | 6/1997 | Shiraishi |
| 5,657,138 | A | 8/1997 | Lewis |
| 5,663,784 | A | 9/1997 | Tanimoto |
| 5,677,754 | A | 10/1997 | Makinouchi |
| 5,693,439 | A | 12/1997 | Tanaka |
| 5,699,145 | A | 12/1997 | Makinouchi |
| 5,699,146 | A | 12/1997 | Kaminaga |
| 5,703,675 | A | 12/1997 | Hirukawa |
| 5,710,620 | A | 1/1998 | Taniguchi |
| 5,729,331 | A | 3/1998 | Tanaka |
| 5,780,943 | A | 7/1998 | Ono |
| 5,781,225 | A | 7/1998 | Syracuse |
| 5,815,248 | A | 9/1998 | Nishi |
| 5,815,249 | A | 9/1998 | Nishi |
| 5,831,716 | A | 11/1998 | Tanimoto |
| 5,835,195 | A | 11/1998 | Gibson |
| 5,852,518 | A | 12/1998 | Hatasawa |
| 5,854,671 | A | 12/1998 | Nishi |
| 5,861,944 | A | 1/1999 | Nishi |
| 5,883,702 | A | 3/1999 | Tokunaga |
| 5,894,056 | A | 4/1999 | Kakizaki |
| 5,940,789 | A | 8/1999 | Yuan |
| 5,959,650 | A | 9/1999 | Fukui |
| 5,981,117 | A | 11/1999 | Magome |
| 5,982,475 | A | 11/1999 | Bruning |
| 5,991,009 | A | 11/1999 | Nishi |
| 6,007,971 | A | 12/1999 | Star |
| 6,040,096 | A | 3/2000 | Kakizaki |
| 6,078,381 | A | 6/2000 | Suzuki |
| 6,100,515 | A | 8/2000 | Nishi |
| 6,104,474 | A | 8/2000 | Suzuki |
| 6,154,270 | A | 11/2000 | Ozawa |
| 6,157,497 | A | 12/2000 | Kumazawa |
| 6,172,739 | B1 | 1/2001 | Murata |
| 6,201,598 | B1 | 3/2001 | Arai |
| 6,222,615 | B1 | 4/2001 | Suzuki |
| 6,259,510 | B1 | 7/2001 | Suzuki |
| 6,259,511 | B1 | 7/2001 | Makinouchi |
| RE37,309 | E | 8/2001 | Nakashima |
| RE37,391 | E | 9/2001 | Nishi |
| 6,285,437 | B1 | 9/2001 | Tokunaga |
| 6,288,772 | B1 | 9/2001 | Shinozaki |
| 6,317,195 | B1 | 11/2001 | Taniguchi |
| 6,319,641 | B2 | 11/2001 | Magome |
| 6,331,885 | B1 | 12/2001 | Nishi |
| 6,351,305 | B1 | 2/2002 | Tanaka |
| 6,391,503 | B2 | 5/2002 | Ebihara |
| 6,396,071 | B1 | 5/2002 | Nishi |
| 6,411,364 | B1 | 6/2002 | Suzuki |
| 6,414,743 | B1 | 7/2002 | Nishi |
| 6,433,872 | B1 | 8/2002 | Nishi |
| 6,456,360 | B1 | 9/2002 | Mori |
| 6,456,363 | B2 | 9/2002 | Suzuki |
| 6,462,807 | B1 | 10/2002 | Nishi |
| RE37,913 | E | 11/2002 | Nishi |
| 6,480,262 | B1 | 11/2002 | Tanaka |
| RE37,946 | E | 12/2002 | Nishi |
| 6,496,247 | B2 | 12/2002 | Suzuki |
| 6,501,533 | B1 | 12/2002 | Murata |
| 6,509,954 | B1 | 1/2003 | Tanaka |
| 6,522,386 | B1 | 2/2003 | Nishi |
| RE38,038 | E | 3/2003 | Tanaka |
| 6,538,723 | B2 | 3/2003 | Hagiwara |
| RE38,085 | E | 4/2003 | Nishi |
| 6,549,266 | B1 | 4/2003 | Taniguchi |
| 6,556,278 | B1 | 4/2003 | Tanaka |
| 6,559,925 | B2 | 5/2003 | Taniguchi |
| 6,573,515 | B1 | 6/2003 | Suzuki |
| 6,583,854 | B1 | 6/2003 | Hazama |
| RE38,176 | E | 7/2003 | Wakamoto |
| 6,590,633 | B1 | 7/2003 | Nishi |
| 6,603,533 | B2 | 8/2003 | Go |
| 6,608,665 | B1 | 8/2003 | Nishi |
| 6,608,681 | B2 | 8/2003 | Tanaka |
| 6,707,536 | B2 | 3/2004 | Nishi |
| 6,713,747 | B2 | 3/2004 | Tanimoto |
| 6,724,463 | B2 | 4/2004 | Taniguchi |
| 6,753,948 | B2 | 6/2004 | Taniguchi |
| 6,795,169 | B2 | 9/2004 | Tanaka |
| 6,864,955 | B2 | 3/2005 | Nishi |
| 6,894,763 | B2 | 5/2005 | Murakami |
| 6,900,879 | B2 | 5/2005 | Nishi |
| 6,906,782 | B2 | 6/2005 | Nishi |
| 6,937,911 | B2 | 8/2005 | Watson |
| RE38,798 | E | 9/2005 | Nishi |
| 7,023,527 | B2 | 4/2006 | Tanaka . |
| RE39,083 | E | 5/2006 | Nishi |
| 7,088,425 | B2 | 8/2006 | Tanaka |
| 7,154,922 | B2 | 12/2006 | Hattori |
| RE39,846 | E | 9/2007 | Tanitsu |
| 7,372,543 | B2 | 5/2008 | Tanaka |
| 7,372,544 | B2 | 5/2008 | Tanaka |

FOREIGN PATENT DOCUMENTS

| Country | Number | Date |
|---|---|---|
| DE | 8422303 U1 | 4/1988 |
| DE | 3639346 A1 | 5/1988 |
| DE | 3427611 A1 | 6/1988 |
| DE | 8618972 U1 | 7/1988 |
| EP | 43863 B1 | 5/1984 |
| EP | 111707 A3 | 9/1986 |
| EP | 253283 A3 | 7/1988 |
| EP | 1130472 | 9/2001 |
| EP | 0633506 | 10/2004 |
| EP | 1480258 | 11/2004 |
| GB | 331765 | 7/1930 |
| GB | 349907 | 5/1931 |
| GB | 1 200 383 | 7/1970 |
| GB | 1 315 256 | 5/1973 |
| GB | 1510007 | 5/1978 |
| GB | 2 078 986 | 1/1982 |
| GB | 2 090 669 | 7/1982 |
| GB | 2 125 976 | 3/1984 |
| JP | 57-139951 | 2/1956 |
| JP | 57-167443 | 4/1956 |
| JP | 57-170142 | 4/1956 |
| JP | 50-134768 | 10/1975 |
| JP | 51-86975 | 7/1976 |
| JP | 53-25790 | 3/1978 |
| JP | 53-124417 | 10/1978 |
| JP | 53-149766 | 12/1978 |
| JP | 54-8070 | 1/1979 |
| JP | 56-7962 | 2/1981 |
| JP | 56-111218 | 9/1981 |
| JP | 58-125033 | 7/1983 |
| JP | 59-113426 | 6/1984 |
| JP | 59-26362 | 7/1984 |
| JP | 61-5247 | 1/1986 |
| JP | 61-84603 | 4/1986 |
| JP | 61-251025 | 11/1986 |
| JP | 61-280619 | 12/1986 |
| JP | 62-176129 | 8/1987 |
| JP | 62-193125 | 8/1987 |
| JP | 63-1032 | 1/1988 |
| JP | 63-55550 | 3/1988 |
| JP | 63-73520 | 4/1988 |
| JP | 63-174046 | 7/1988 |
| JP | 01136140 A | 5/1989 |
| JP | 01237536 A | 9/1989 |
| JP | 2-65222 | 3/1990 |

| | | |
|---|---|---|
| JP | 02065222 A | 3/1990 |
| JP | 02091635 A | 3/1990 |
| JP | 2-229423 | 9/1990 |
| JP | 3-21952 | 1/1991 |
| JP | 03213843 A | 9/1991 |
| JP | 4-196513 | 7/1992 |
| JP | 4-277612 | 10/1992 |
| JP | 6-510397 | 11/1994 |
| JP | 2729058 | 12/1997 |
| WO | WO2004066371 | 8/2004 |

OTHER PUBLICATIONS

Lin, B. J. (Dec. 1987). "The Future of Subhalf–Micrometer Optical Lithography," *Microelectronic Engineering* 6:31–51.

NPI00114663–NPI00114747 ("Final Report").

*Andersen Corp v. Pella Corp.*, 2008 U.S. App. LEXIS 24087 (Fed. Cir. Nov. 19, 2008).

German Patent Office Action, Oct. 6, 1997 (ANV0000023926–ANV0000023928), with translation.

Japanese Laid–Open Patent Pub. No. 2–229423, Sep. 2, 1990.

Japanese Application Examination Request Form, Oct. 4, 1996.

Japanese Patent Office Action, Nov. 17, 1998 (NC00458996), with translation (ANV0000000471–ANV0000000472).

Letter filed with Japanese Patent Office, Feb. 17, 1999.

Amendment filed with Japanese Patent Office, Feb. 17, 1999.

Japanese Patent Certificate, Jul. 30, 1999 (ANV0000000545–ANV0000000546).

Japanese Patent Publication, Oct. 6, 1999 (ANV0000000528–ANV0000000544).

Japanese Patent Office receipt for annuity payment, mid– to late–2003 (ANV0000000457–ANV0000000458).

Post–issuance opposition document filed with Japanese Patent Office, with copies of purported prior art references (NC00458884–NC00458991).

Japanese Patent Office Determination of Rejection (NC00458849–NC00458850).

American Vacuum Society, Bruning, Optical imaging for microfabrication, p. 1147–1155, *Journal of Vacuum Science and Technology*, Sep. 1980.

American Vacuum Society, Buckley/Galburt/Karatzas, Step–and–scan lithography using reduction optics, p. 1607–1612, *Journal of Vacuum Science and Technology*, Nov./Dec. 1989.

Annual Reviews Inc., Reichmanis/Thompson, Polymer Materials for Microlithography, p. 235–271, *Annual Review of Materials Science*, 1987.

Beesley/Castledine/Cooper, Sensitivity of Resist–coated Silicon Slices to Argon–laser Wavelengths, p. 257–258, *Electronics Letters*, Jun. 12, 1969.

Comiti du Colloque International sur La Microlithographie, Dubroeucq/Sullerot/Lacombat/Prolonge/Tonnel, Double diffraction gratings as registration marks: design and performance on the ARW wafer stepper, p. 99–104, *Microcircuit Engineering*, 1982.

Elsevier Science B.V., Fay, Advanced optical lithography development, from UV to EUV, p. 11–24, *Microelectronic Engineering*, Jan. 1, 2002.

Elsevier Science Publishers B.V., Goodall/Lawes/Sharp, Excimer Laser as Deep UV Sources for Photolithographic System, p. 445–452, *Microcircuit Engineering*, Dec. 23, 1986.

Elsevier Science Publishers B.V., Latta/Jain, Beam Intensity Uniformization by Mirror Folding, p. 435–439, *Optics Communications*, Apr. 15, 1984.

Elsevier Science Publishers B.V., Saito/Oshima/Honda/Tsujiuchi, An Improved Technique for Holographic Recording on a Thermoplastic Photoconductor, p. 90–95, *Optics Communications*, Jan. 1976.

Gordon, Video Recording, Film Considerations, p. 779–782, *Proceedings of the I.R.E.*, Jul. 1952.

H.P. Books, Shipman, *Understanding Photography*, p. 35, 1974.

Hinsberg/MacDonald/Clecak/Snyder, Fundamental Studies of Airborne Chemical Contamination of Chemically Amplified Resists, p. 535–546, *Journal of Photopolymer Science and Technology*, 1993.

IBM, Bohlen/Keyser/Zapka, Homogeneous Illuminations of Electron Beam Transmission Masks, p. 6371–6372, *IBM Technical Disclosure Bulletin*, May 1984.

IBM, Davis, 45° Aperture Pair for E–Beam Spot Shaping, p. 597–600, *IBM Technical Disclosure Bulletin*, Jul. 1982.

IBM, Giuffre/Michail/Simpson/Stickel, E–Beam Writing at High Exposure Doses, p. 2277, *IBM Technical Disclosure Bulletin*, Nov. 1980.

IBM, Hakey/Burlington, Method to Control Image Size Uniformity in High Contrast Photoresist, p. 331–332, *IBM Technical Disclosure Bulletin*, Jan. 1988.

IBM, Laming, Line–Width Control for Micropattern Generation, p. 951, *IBM Technical Disclosure Bulletin*, Sep. 1970.

IBM, Lin, Double–Wafer–Chuck System to Facilitate Rapid and Accurate Alignment, p. 2274–2276, *IBM Technical Disclosure Bulletin*, Oct. 1986.

IBM, Maldonado, Method to Increase Sensitivity of Negative Resists, p. 2969–2970, *IBM Technical Disclosure Bulletin*, Dec. 1986.

IBM, Pesacreta, Registration Enhancement Through an Opaque Underlayer for a Step and Repeat Exposure System, p. 424, *IBM Technical Disclosure Bulletin*, Sep. 1988.

IBM, Quickle, Spot Overlap in a Variably Shaped Spot Electron–Beam Exposure Tool, p. 79–81, *IBM Technical Disclosure Bulletin*, Jun. 1981.

IBM, Starikov, Extended Focal Depth Optical Microlithography, p. 125–127, *IBM Technical Disclosure Bulletin*, Jun. 1989.

IBM, Wisnieff, Integrated Photosensing and Photomasking Element for Macrolithography, p. 14–17, *IBM Technical Disclosure Bulletin*, Aug. 1988.

IEEE, Chen/Mort/Tabak, Photoinduced Discharge Characteristics of Xerographic Photoreceptors, p. 413–421, *Transactions on Electron Devices*, Apr. 1972.

IEEE, Comizzoli/Lozier/Ross, Electrophotography—A Review, p. 348–369, *Proceedings of the IEEE*, Apr. 1972.

IEEE, Dill/Neureuther/Tuttle/Walker, Modeling Projection Printing of Positive Photoresists, p. 456–464, *Transactions on Electron Devices*, Jul. 1975.

IEEE, Kerth/Jain/Latta, Excimer Laser Projection Lithography on a Full–Field Scanning Projection System, p. 299–301, *IEEE Electron Device Letters*, May 1986.

IEEE, Rice/Jain, Reciprocity Behavior of Photoresists in Excimer Laser Lithography, p. 1–3, *Transactions on Electron Devices*, Jan. 1984.

IEEE, Shacham–Diamand, Modeling of Novolak–Based Positive Photoresist Exposed to KrF Excimer Laser UV Radiation at 248 nm, p. 37–44, *Transactions on Semiconductor Manufacturing*, May 1990.

IEEE, Sheats, Reciprocity Failure in Novolak/Diazoquinone Photoresist with 364–nm Exposure, p. 129–131, *Transactions on Electron Devices*, Jan. 1988.

IEEE, Spears/Serafin/Abramson/Zhu/Bjelkhagen, Chrono–Coherent Imaging for Medicine, p. 1210–1221, *Transactions on Biomedical Engineering*, Dec. 1989.

Kawamura/Itagaki/Toyoda/Namba, Deep UV lithography by using excimer lasers (photo–etching characteristics and development of uniform intensity irradiation system), p. WA4–1–WA4–2, *A Digest of Technical Papers Presented at the Topical Meeting on Excimer Lasers*, Jan. 10, 1983.

Kodak, Coffey, An X–Y Measurement System, p. 3–14, *Interface 78*, 1978.

Lacombat/Massin/Dubroeucq/Brévignon, Laser Projection Printing, p. 115–121, *Solid State Technology*, Aug. 1980.

Markle, A New Projection Printer, p. 50–53, *Solid State Technology*, Jun. 1974.

Markle, The Future and Potential of Optical Scanning Systems, p. 159–166, *Solid State Technology*, Sep. 1984.

Materials Research Society, Higashikawa/Nonaka/Sato/Nakase/Ito/Horioka/Horiike, Recent Progress in Excimer Laser Lithography, p. 3–12, *Materials Research Society Symposium Proceedings*, Apr. 1988.

MIT Libraries, DeVito, Electric Field Controlled Optical Scattering in Nematic Liquid Crystal Films, p. 1–48, Massachusetts Institute of Technology thesis, Jun. 1975.

Morgan State University, Hammond, The Calibration of Photographic and Spectroscopic Films, p. 1–10, semi–annual report, May 1, 1987–Oct. 30, 1987.

NASA, Clifton/Benson, Analysis of Contamination Data Recorded by the IECM Camera/Photometer, p. 1–51, *NASA Technical Memorandum*, Mar. 1988.

North–Holland Publishing Company, Koops, Electron Beam Projection Techniques, p. 235–335, *Fine Line Lithography*, 1980.

North–Holland Publishing Company, Lin, Optical Methods for Fine Line Lithography, p. 107–232, *Fine Line Lithography*, 1980.

North–Holland Publishing Company, Maddox/Splinter, Dry Processing Methods, p. 339–415, *Fine Line Lithography*, 1980.

North–Holland Publishing Company, Weber, Application of Electron Beam Technology to Large Scale Integrated Circuits, p. 419–478, *Fine Line Lithography*, 1980.

North–Holland Publishing Company, Wittels, Fundamentals of Electron and X–ray Lithography, p. 3–104, *Fine Line Lithography*, 1980.

Offner, New Concepts in Projection Mask Aligners, p. 130–132, *Optical Engineering*, Mar. 4, 1975.

Optical Society of America, Becker/Sopori/Chang, Focused laser lithographic system, p. 1069–1071, *Applied Optics*, Apr. 1, 1978.

Optical Society of America, Burton/Hatter/Ridgeley, Photographic Sensitivity Measurements in the Vacuum Ultraviolet, p. 1851–1857, *Applied Optics*, Aug. 1973.

Optical Society of America, Chang/George, Holographic Dielectric Grating: Theory and Practice, p. 713–719, *Applied Optics*, Mar. 1970.

Optical Society of America, Jain/Kerth, Excimer laser projection lithography, p. 648–650, *Applied Optics*, Mar. 1, 1984.

Optical Society of America, Johnson/Armstrong/Hesselink/Goodman, Multiple multiple–exposure hologram, p. 4467–4472, *Applied Optics*, Dec. 15, 1985.

Optical Society of America, Johnson/Hesselink/Goodman, Holographic reciprocity law failure, p. 218–227, *Applied Optics*, Jan. 15, 1984.

Optical Society of America, Nov., Photometric photography. I. The multiple–filter method for characteristic curve measurement, p. 351–359, *Journal of the Optical Society of America*, Mar. 1988.

Optical Society of America, Schubert, Periodic image artifacts from continuous–tone laser scanners, p. 3880–3884, *Applied Optics*, Nov. 1, 1986.

Optical Society of America, Tellinghuisen, Characteristic curves for photographic emulsions from nonlinear fitting: a study of statistical and model error, p. 1723–1729, *Applied Optics*, May 1, 1991.

Radiation Physics, Grossman/Van Tulnen/Kruger/Scholz, Film Reciprocity Law Failure in Scintillation Camera Imaging, p. 697–700, *Radiology*, Mar. 1981.

Scientific American, Inc., Oldham, The Fabrication of Microelectronic Circuits, p. 111–128, *Microelectronics*, Sep. 1, 1977.

Society of Photo–Optical Instrumentation Engineers, Nakase, Potential of optical lithography, p. 319–324, *Optical Engineering*, Apr. 1987.

SPIE, Ausschnitt, Overlay performance of the Perkin–Elmer Model 500, p. 64–72, *Proceedings of SPIE* vol. 394, 1983.

SPIE, Beaulieu/Hellebrekers, Dark Field Technology—a practical approach to local alignment, p. 142–149, *Optical Microlithography VI*, Mar. 4, 1987.

SPIE, Berry, Pattern recognition automatic fine alignment, p. 10–16, *Optical Microlithography—Technology for the Mid–1980s*, 1982.

SPIE, Buckley/Karatzas, Step and scan: A systems overview of a new lithography tool, p. 424–432, *Optical/Laser Microlithography II*, 1989.

SPIE, Chapman/Tu/Peng, Bi/In Thermal Resist for Both Si Anisotropic Wet Etching And Si/SiO$_2$ Plasma Etching, p. 192–203, *Micromachining and Microfabrication Process Technology IX*, 2004.

SPIE, Chapman/Tu/Peng, Wavelength Invariant Bi/In Thermal Resist As A Si Anisotropic Etch Masking Layer And Direct Write Photomask Material, p. 472–483, *Advances in Resist Technology and Processing XX*, 2003.

SPIE, Endo/Sasago/Hirai/Ogawa/Ishihara, Half–micron KrF excimer laser stepper lithography with new resist and water–soluble contrast enhanced materials, p. 138–146, *Lasers in Microlithography*, 1987.

SPIE, Gelbart/Karasyuk, UV Thermoresists: Sub 100nm Imaging Without Proximity Effects, p. 786–793, *SPIE, Conference on Emerging Lithographic Technologies III*, Mar. 1999.

SPIE, Goodall/Lawes, Excimer laser photolithography with 1:1 Wynne–Dyson optics, p. 410–416, *Optical/Laser Microlithography*, Mar. 2, 1988.

SPIE, Greed/Markle, Variable Magnification in a 1:1 Projection Lithography System, p. 2–9, *Optical Microlithography—Technology for the Mid–1980s,* 1982.

SPIE, Hershel, Autoalignment in step–and–repeat wafer printing, *Developments in Semiconductor Microlithography IV,* p. 54–62, 1979.

SPIE, Hershel/Voison, Characterization of the Ultratech wafer stepper, p. 44–51, *Optical Microlithography—Technology for the Mid–1980s,* 1982.

SPIE, Jaanimagi/Hestdalen, Streak camera phosphors: Response to ultra–short excitation, p. 443–448, *Ultrahigh– and High–Speed Photography, Videography, Photonics, and Velocimetry,* 1990.

SPIE, Jain, Advances in Excimer Laser Lithography, p. 115–123, *Lasers in Microlithography,* 1987.

SPIE, Kameyama/Ushida, Excimer Laser Stepper for Submicron Lithography, p. 147–154, *Lasers in Microlithography,* Mar. 2, 1987.

SPIE, King/Muraski, New generation of 1:1 optical projection mask aligners, p. 70–74, *Developments in Semiconductor Microlithography IV,* 1979.

SPIE, Leebrick/Hockey/Cummings/Greeneich, Automated wafer stepping for very large scale integrated (VLSI) fabrication, p. 111–117, *Optical Microlithography—Technology for the Mid–1980s,* 1982.

SPIE, Lin, The Paths To Subhalf–Micrometer Optical Lithography, p. 256–269, *Optical/Laser Microlithography,* Feb. 1988.

SPIE, MacDonald/Clecak/Wendt/Willson/Snyder/Knors/Deyoe/Maltabes/Morrow/McGuide/Holmes, Airborne Chemical Contamination of a Chemically Amplified Resist, p. 2–11, *Advances in Resist Technology and Processing VIII,* 1991.

SPIE, Markle, Deep UV Lithography: Problems and Potential, p. 108–114, *Lasers in Microlithography,* 1987.

SPIE, Mayer/Loebach, A new step–by–step aligner for very large scale integration (VLSI) production, p. 9–18, *Semiconductor Microlithography V,* 1980.

SPIE, McGlothlan, The Tektronix color fiber optic tube (CFOT) for exposure of Mead Imaging's Cycolor and 3M's full color dry silver media, p. 139–146, *Optical Hard Copy and Printing Systems,* 1990.

SPIE, Murakami/Matsuura/Ogawa/Uehara, Laser step alignment for a wafer stepper, p. 9–16, *Optical Microlithography IV,* 1985.

SPIE, Nalamasu/Reichmanis/Cheng/Pol/Kometani/Houlihan/Neenan/Bohrer/Mixon/Thompson/Takemoto, Preliminary Lithographic Characteristics of an All–organic Chemically Amplified Resist Formulation for Single Layer Deep–UV Lithography, p. 13–25, *Advances in Resist Technology and Processing VIII,* 1991.

SPIE, Novak, A New VLSI Printer, p. 36–43, *Developments in Semiconductor Microlithography III,* 1978.

SPIE, Orvek/Palmer/Garza/Fuller, Resists for use in 248 nm excimer laser lithography, p. 83–90, *Advances in Resist Technology and Processing III,* Mar. 11, 1986.

SPIE, Pol/Bennewitz/Escher/Feldman/Firtion/Jewell/Wilcomb/Clemens, Excimer laser–based lithography: a deep ultraviolet wafer stepper, p. 6–16, *Optical Microlithography V,* 1986.

SPIE, Sewell, Step and Scan: the maturing technology, p. 49–60, SPIE, May 1991.

SPIE, Shacham–Diamand/Partlo/Oldham, Characterization of a UV Resist for 248 nm Lithography, p. 502–514, *Advances in Resist Technology and Processing VI,* Feb. 27, 1989.

SPIE, Slonaker/McNamara/Konno/Miller/Murakami/Magome/Umatate/Tateno, Enhanced global alignment for production optical lithography, p. 73–81, *Optical/Laser Microlithography,* Mar. 2, 1988.

SPIE, Smart/Stewart, Laser processing for application specific integrated circuits (ASICs), p. 88–92, *Lasers in Microlithography,* 1987.

SPIE, Spence/Oldham/Partlo/Bruning/Markle/Hsu, Deep–UV Photolithography With a Small–Field 0.6 N.A. 'Microstepper', p. 471–482, *Optical/Laser Microlithography II,* Mar. 1, 1989.

SPIE, Stover, Near–term case for 5× versus 10× wafer steppers, p. 60–69, Optical Microlithography—Technology for the Mid–1980s, 1982.

SPIE, Sugiyama/Tawa/Oshida/Kurosaki/Mizuno, New 5× i–line Projection Aligner for VLSI Fabrication, p. 318–326, *Optical/Laser Microlithography,* Feb. 1988.

SPIE, Suzuki, Double Telecentric Wafer Stepper Using Laser Scanning Method, p. 2–8, *Optical Microlithography IV,* 1985.

SPIE, Suzuki, Laser scanning autoalignment in projection system, p. 35–42, *Semiconductor Microlithography VI,* 1981.

SPIE, Suzuki/Hirose/Hirabayahi, Toward Submicron . . . A New Phase of Optical Stepper, p. 166–172, *Electron–Beam, X–Ray & Ion–Beam Techniques for Submicrometer Lithographies V,* Mar. 11, 1986.

SPIE, Tanimoto/Miyaji/Ichihara/Uemura/Tanaka, Excimer Laser Stepper for Sub–half Micron Lithography, p. 434–440, *Optical/Laser Microlithography,* Mar. 1, 1989.

SPIE, Tigréat, Eurostep 2000: new steps in wafer steppers, p. 90–94, *Optical Microlithography—Technology for the Mid–1980s,* 1982.

SPIE, Tracy/Wu, Exposure Dose Control Techniques for Excimer Laser Lithography, p. 437–443, *Optical/Laser Microlithography,* Mar. 2, 1988.

SPIE, Trutna/Chen, An improved alignment system for wafer steppers, p. 62–69, *Optical Microlithography III: Technology for the New Decade,* 1984.

SPIE, van den Brink/Wittekoek/Linders/van Hout/George, Performance of a wafer stepper with automatic intra–die registration correction, p. 100–117, *Optical Microlithography VI,* 1987.

SPIE, Wangler/Liegel, Design principles for an illumination system using an excimer laser as a light source, p. 129–136, *Optical Microlithography and Metrology for Microcircuit Fabrication,* Apr. 27, 1989.

The Ohio State University, Habiby, Implementation of a Digital Optical Matrix–Vector Multiplier Using a Holographic Look–up Table and Residue Arithmetic, p. 1–155, ElectroScience Laboratory technical report, Aug. 1987.

Thompson/Feit/Heidenreich, Lithography and Radiation Chemistry of Epoxy Containing Negative Electron Resists, p. 529–533, *Polymer Engineering and Science,* Jul. 1974.

Torigoye, Present Status of an Excimer Laser Stepper, p. 33–36, *Proceedings of 1989 International Symposium on MicroProcess Conference,* 1989.

Voshchenkov/Herrmann, Submicron Resolution Deep UV Photolithography, p. 61–62, *Electronics Letters,* Jan. 22, 1981.

Watts/Bruning, A Review of Fine–Line Lithographic Techniques: Present and Future, p. 99–105, *Solid State Technology,* May 1981.

Ziff–David Publishing Company, Krause/Shull, *The Complete Guide to Cibachrome Printing,* p. 77–79, 1980.

EX PARTE REEXAMINATION CERTIFICATE ISSUED UNDER 35 U.S.C. 307

NO AMENDMENTS HAVE BEEN MADE TO THE PATENT

AS A RESULT OF REEXAMINATION, IT HAS BEEN DETERMINED THAT:

The patentability of claims 1, 4–7, 10, 13 and 15–19 is confirmed.

Claims 2, 3, 8, 9, 11, 12, 14 and 20–22 were not reexamined.

\* \* \* \* \*